United States Patent
Sakuma et al.

(10) Patent No.: US 7,026,684 B2
(45) Date of Patent: Apr. 11, 2006

(54) NONVOLATILE SEMICONDUCTOR MEMORY DEVICE

(75) Inventors: Makoto Sakuma, Yokohama (JP); Fumitaka Arai, Yokohama (JP); Yasuhiko Matsunaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 10/940,844

(22) Filed: Sep. 15, 2004

(65) Prior Publication Data
US 2005/0087795 A1 Apr. 28, 2005

(30) Foreign Application Priority Data
Sep. 22, 2003 (JP) ............... 2003-329996

(51) Int. Cl.
*H01L 29/788* (2006.01)

(52) U.S. Cl. .................. 257/315; 257/316; 257/317
(58) Field of Classification Search ................ 257/315, 257/316, 317

See application file for complete search history.

(56) References Cited

U.S. PATENT DOCUMENTS

| 6,888,755 B1 * | 5/2005 | Harari | 365/185.18 |
| 6,897,116 B1 * | 5/2005 | Lee et al. | 438/267 |
| 6,908,817 B1 * | 6/2005 | Yuan | 438/264 |
| 2002/0080659 A1 * | 6/2002 | Shin et al. | 365/200 |

FOREIGN PATENT DOCUMENTS

| JP | 7-50396 | 2/1995 |
| JP | 11-145429 | 5/1999 |
| JP | 2002-50703 | 2/2002 |
| JP | 2002-217318 | 8/2002 |

OTHER PUBLICATIONS

U.S. Appl. No. 10/648,510, filed Aug. 27, 2003, Fumitaka Arai et al.
U.S. Appl. No. 10/832,381, filed Apr. 27, 2004, Koji Sakui et al.
Y. Sasago, et al. "10-MB/$_s$ Multi-Level Programming of Gb-Scale Flash Memory Enabled by New AG-AND Cell Technology", IEEE IEDM, 2002, pp. 952-954.

* cited by examiner

*Primary Examiner*—Trung Dang
(74) *Attorney, Agent, or Firm*—Oblon, Spivak, McClelland, Maier & Neustadt, P.C.

(57) ABSTRACT

Floating gates and control gates are alternately arranged on a substrate periodically in a first direction via a gate insulation film. Each floating gate has a first portion whose sectional shape is rectangular, and a second portion which is positioned substantially in a middle portion of the first portion and whose sectional shape is rectangular and whose length in a direction parallel to the first direction is smaller than that of the first portion. Each control gate has a third portion between the second portions of a pair of adjacent floating gates, and a fourth portion positioned between the first portions of a pair of adjacent floating gates. The floating gate and a pair of control gates positioned on opposite sides of the floating gate constitute one memory cell, the adjacent memory cells share the control gate positioned between the memory cells.

20 Claims, 22 Drawing Sheets

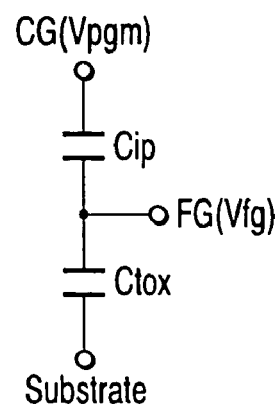
F I G. 4

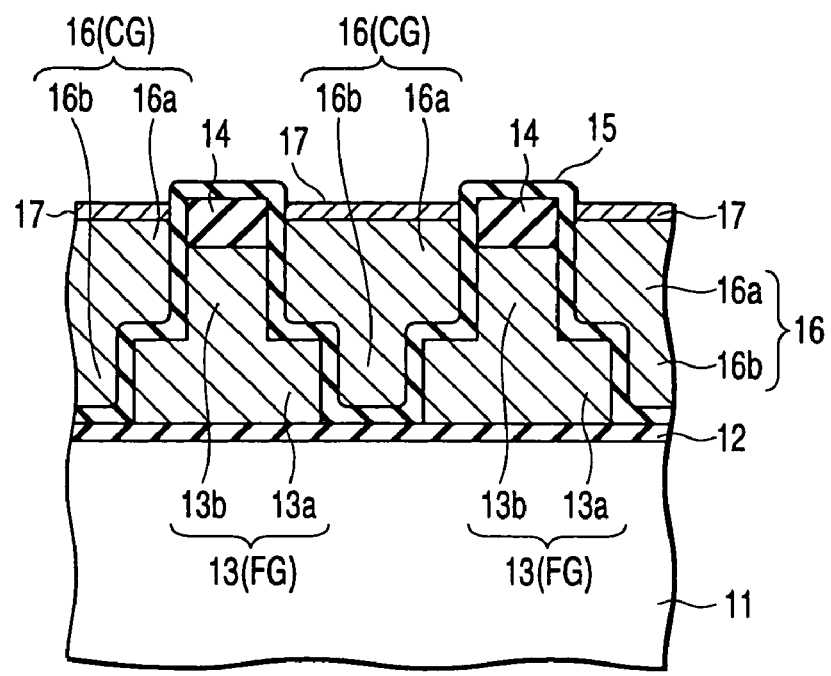
F I G. 6
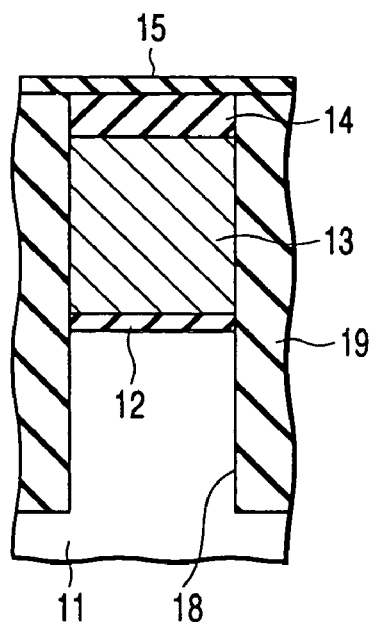
F I G. 7

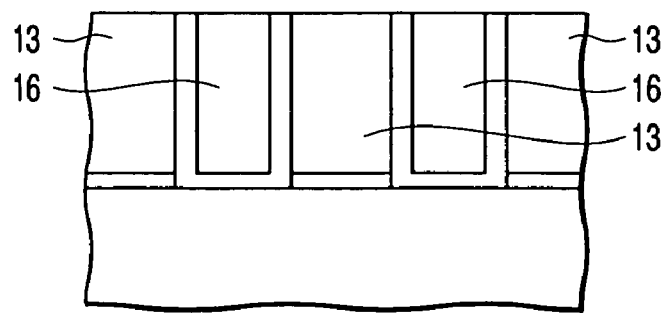
F I G. 11
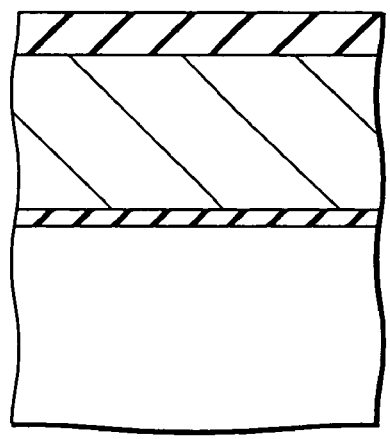
F I G. 12 A
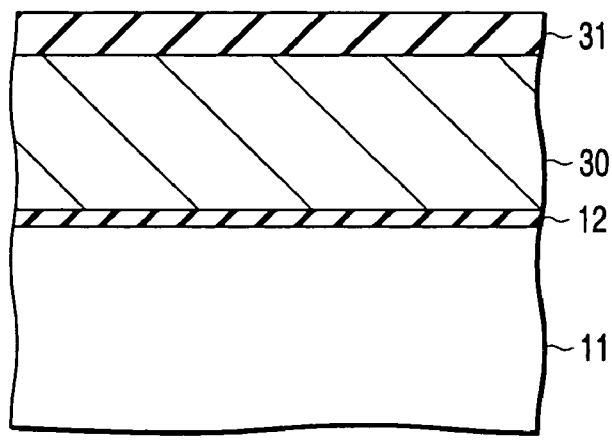
F I G. 12 B
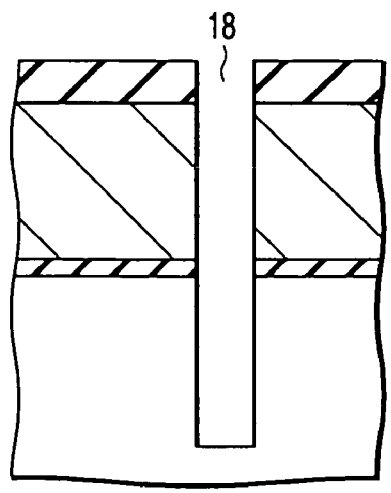
F I G. 13 A
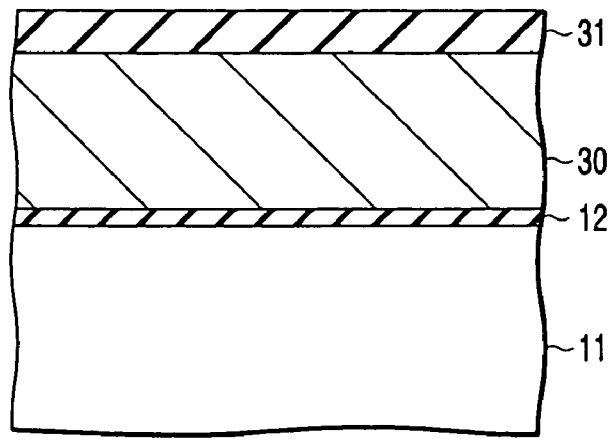
F I G. 13 B

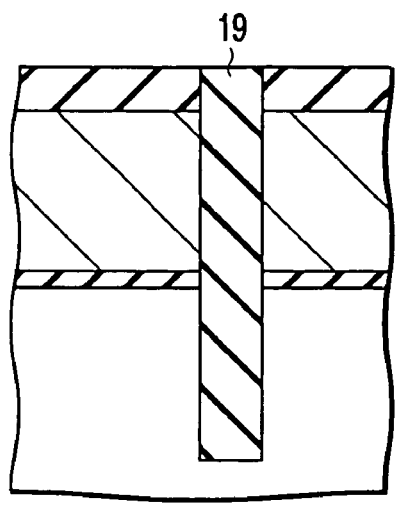
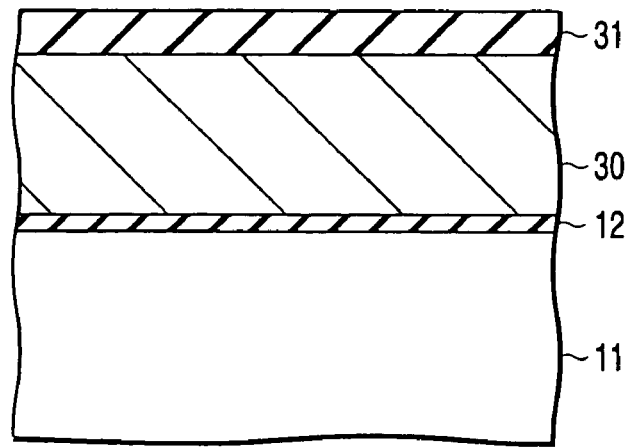
FIG. 14A
FIG. 14B
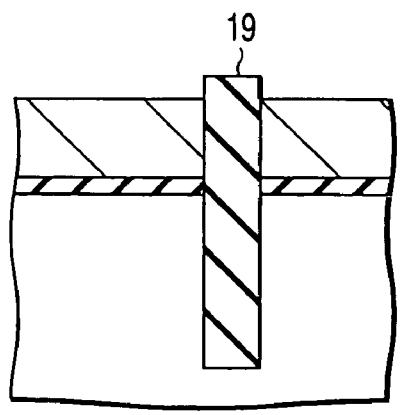
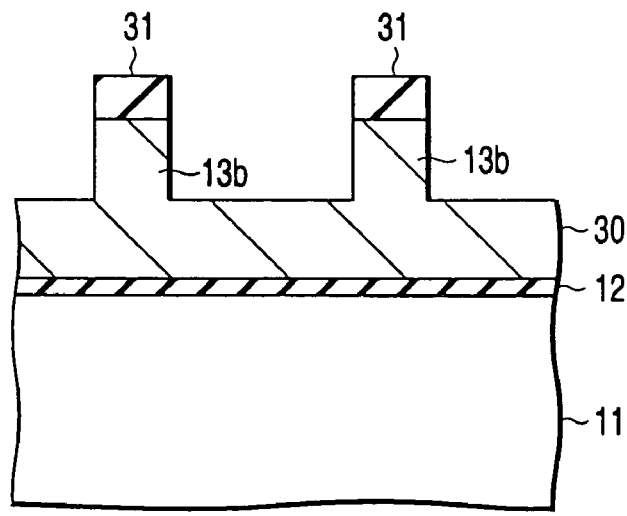
FIG. 15A
FIG. 15B

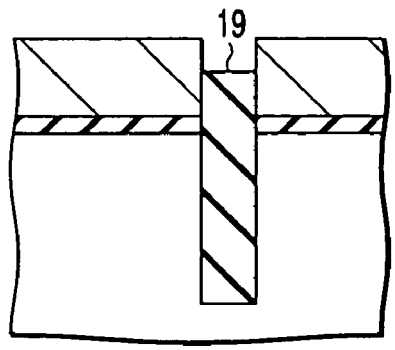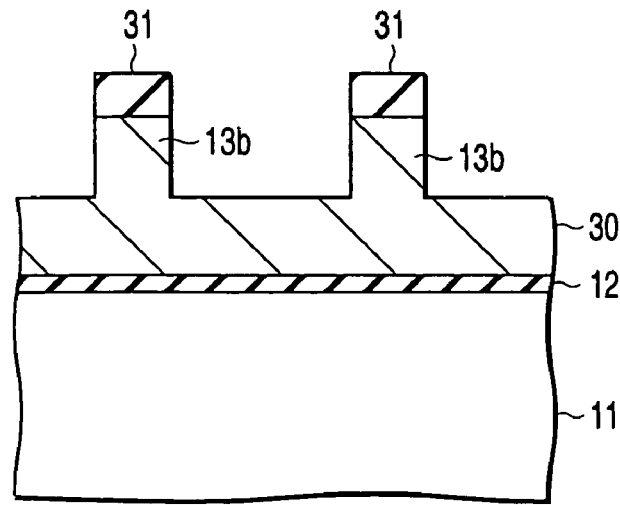
FIG. 16A  FIG. 16B
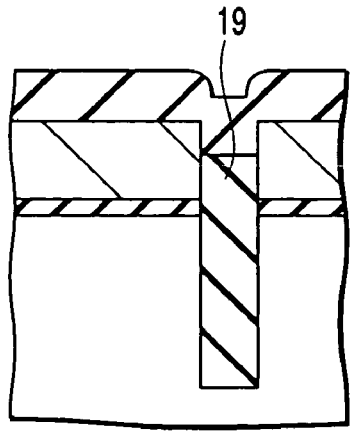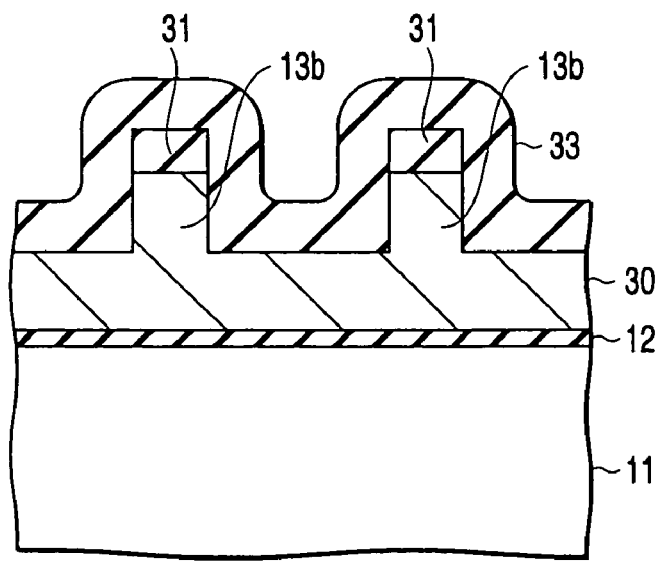
FIG. 17A  FIG. 17B

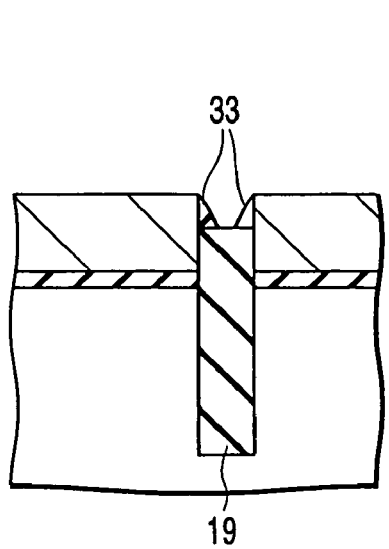
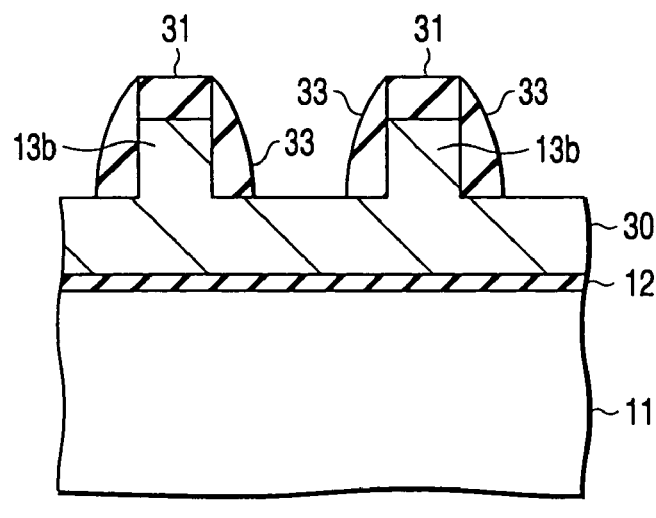
FIG. 18A  FIG. 18B
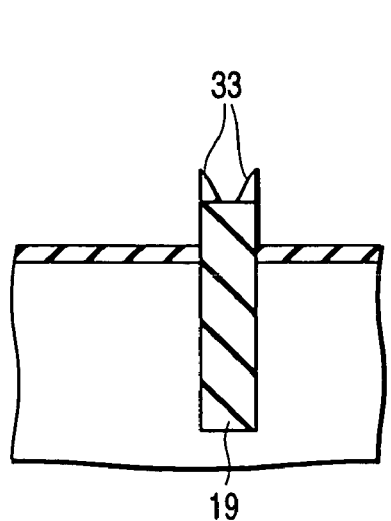
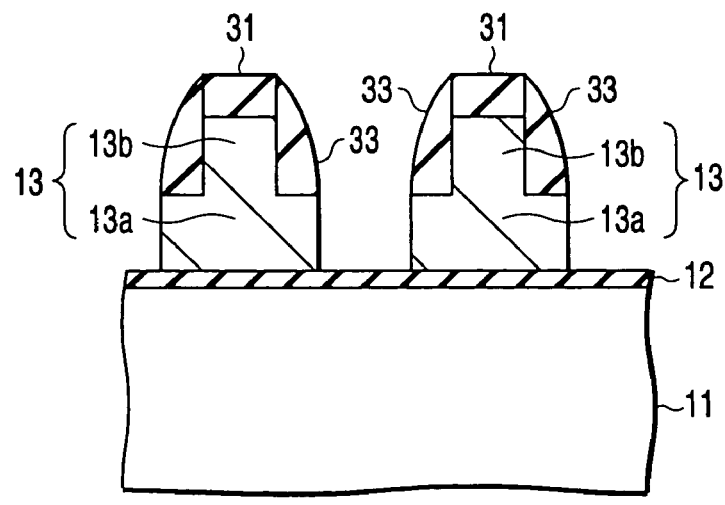
FIG. 19A  FIG. 19B

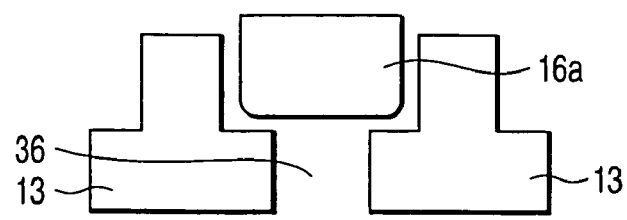
F I G. 24
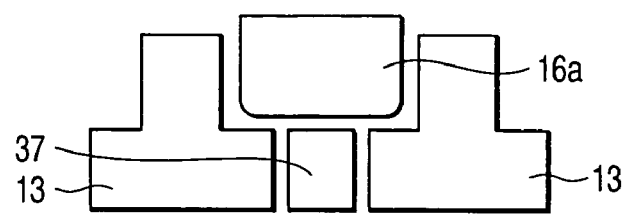
F I G. 25
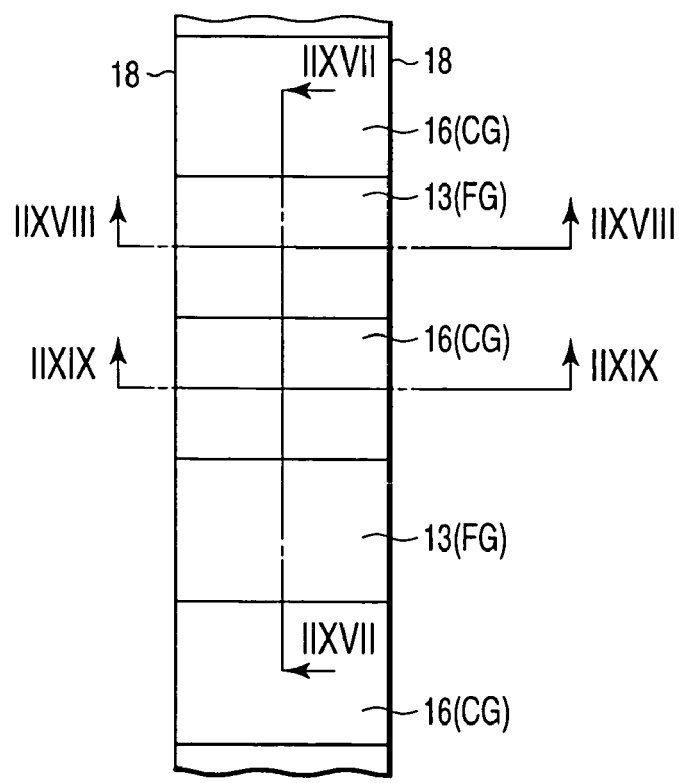
F I G. 26

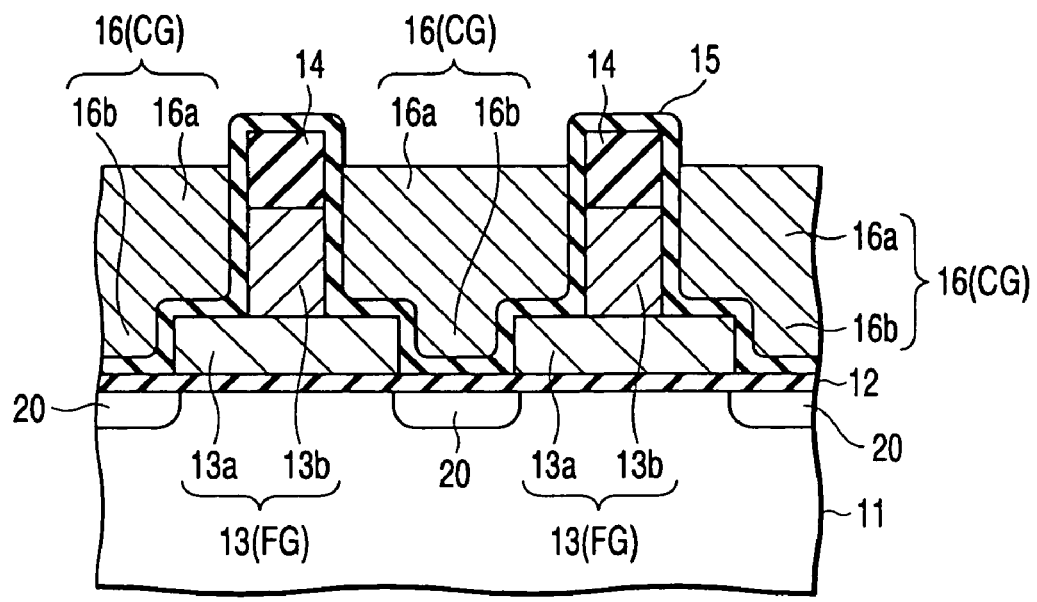
F I G. 2 7
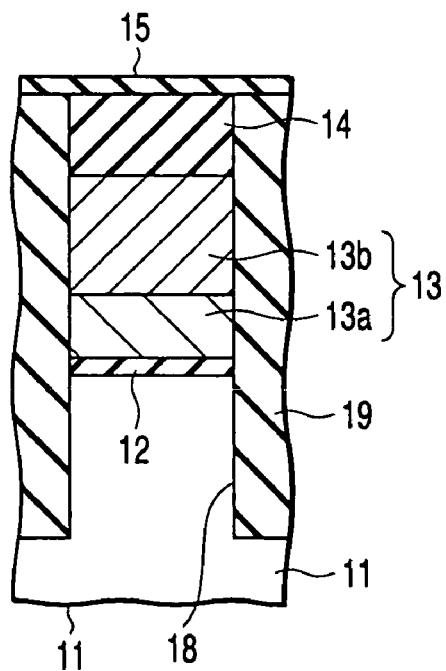
F I G. 2 8

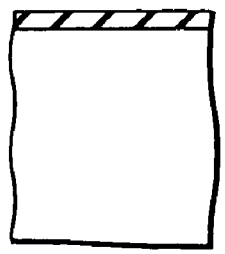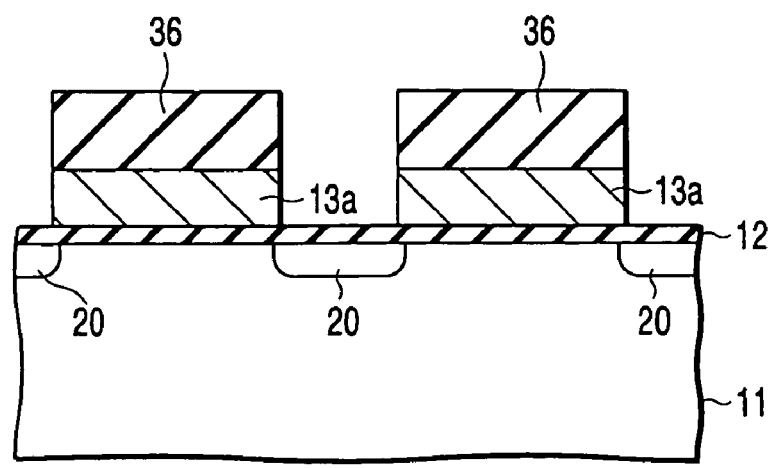
FIG.31A    FIG.31B
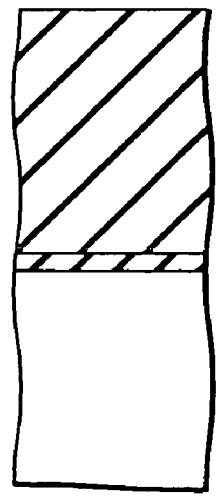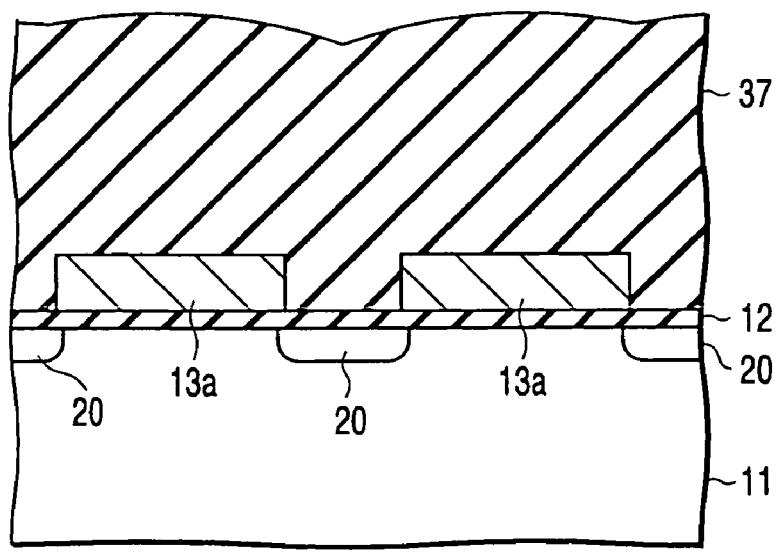
FIG.32A    FIG.32B

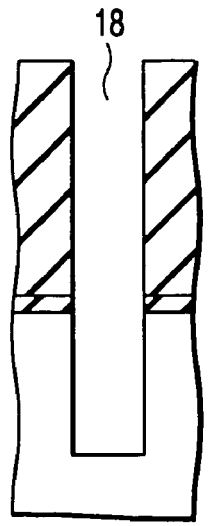
F I G. 3 3 A
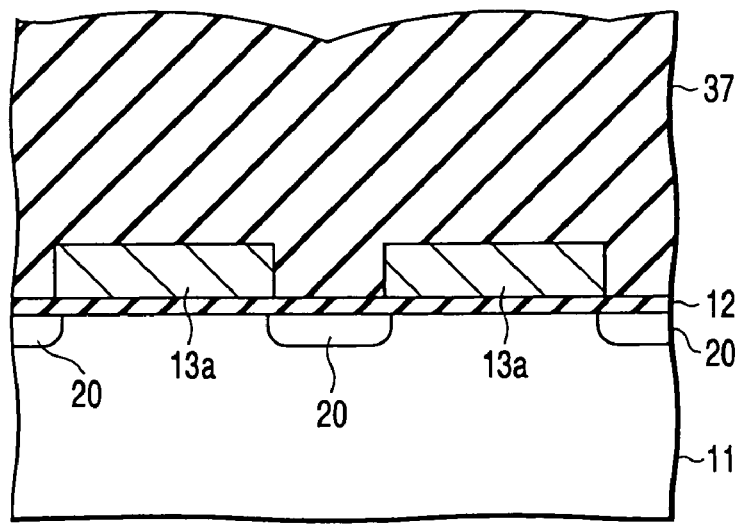
F I G. 3 3 B
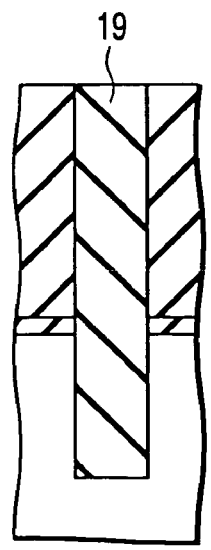
F I G. 3 4 A
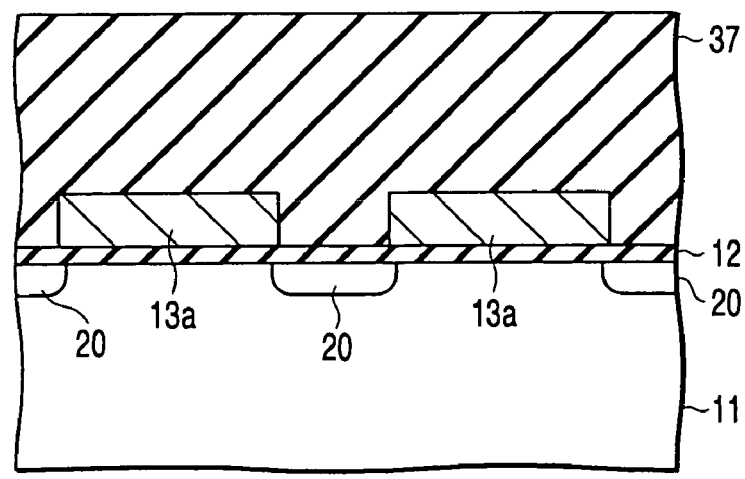
F I G. 3 4 B

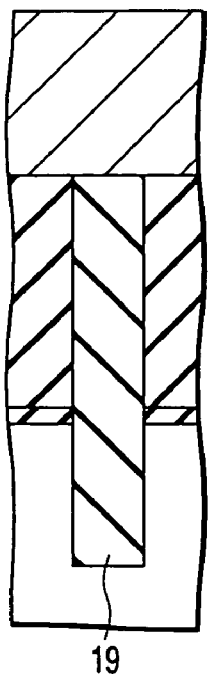 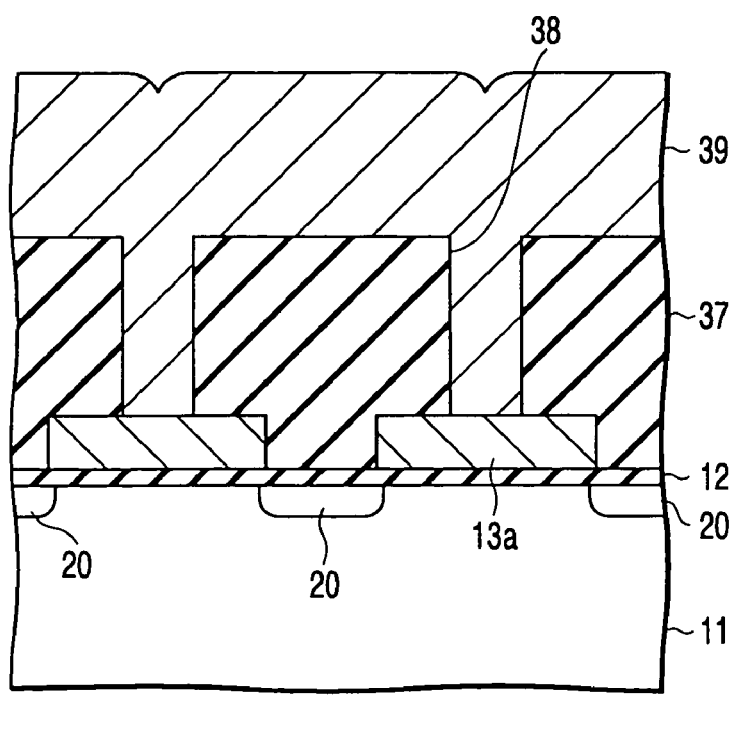
F I G. 35 A              F I G. 35 B
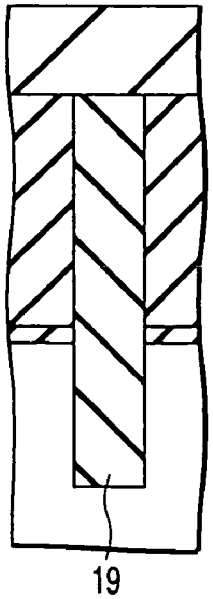 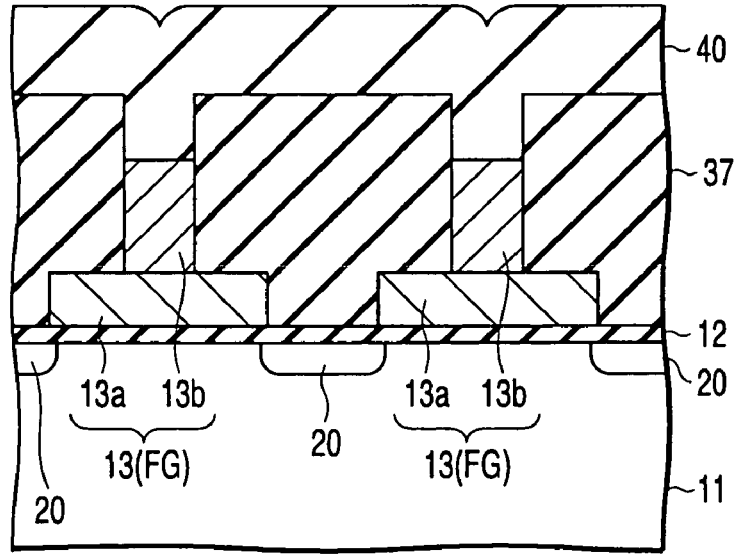
F I G. 36 A              F I G. 36 B

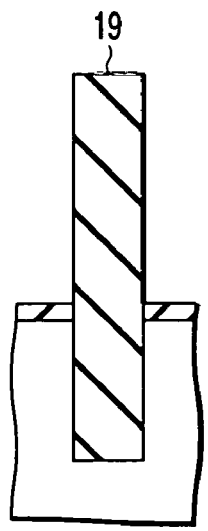
F I G. 37 A
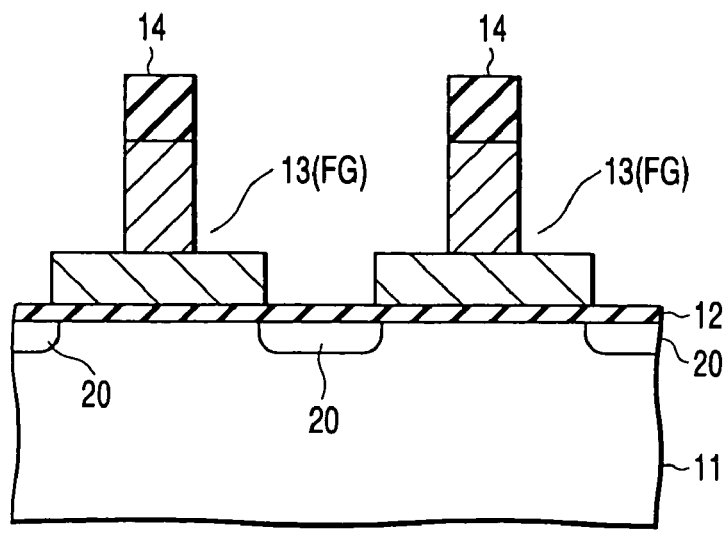
F I G. 37 B
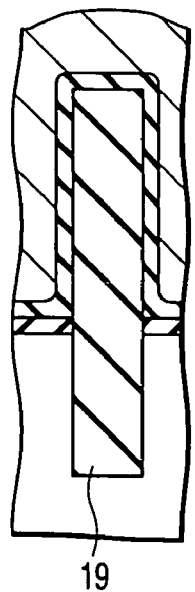
F I G. 38 A
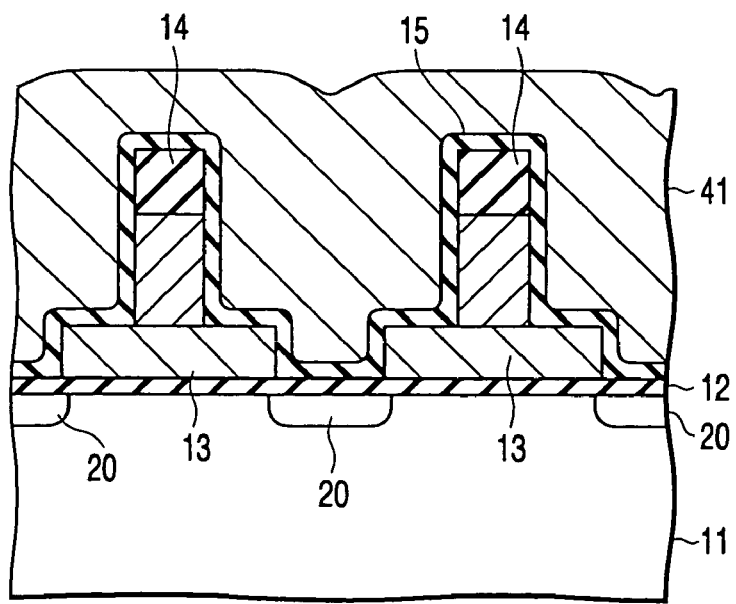
F I G. 38 B

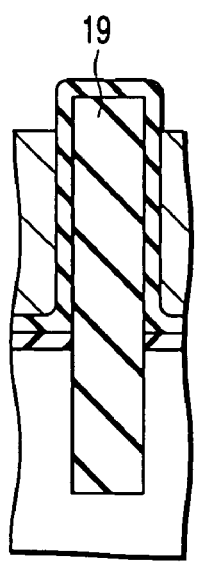
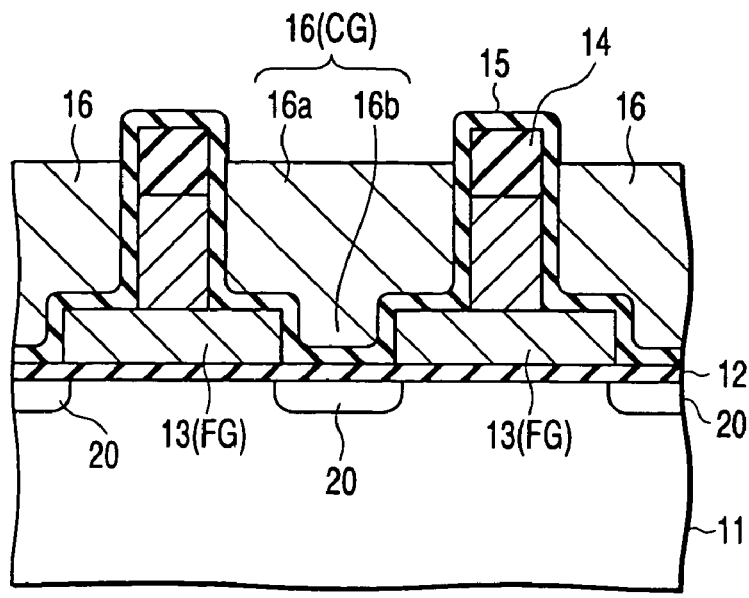
FIG. 39A          FIG. 39B
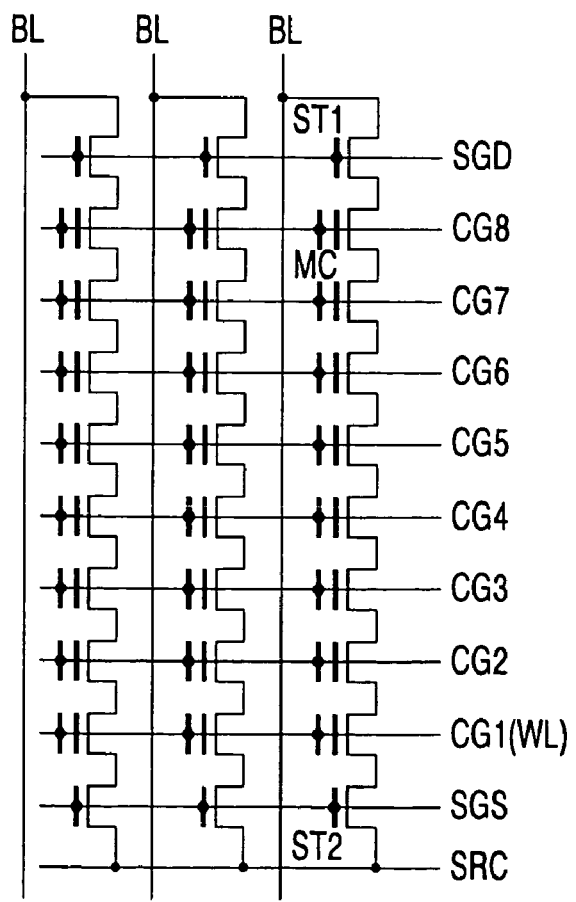
FIG. 40

NONVOLATILE SEMICONDUCTOR MEMORY DEVICE

CROSS-REFERENCE TO RELATED APPLICATIONS

This application is based upon and claims the benefit of priority from prior Japanese Patent Application No. 2003-329996, filed Sep. 22, 2003, the entire contents of which are incorporated herein by reference.

BACKGROUND OF THE INVENTION

1. Field of the Invention

This invention relates to a nonvolatile semiconductor memory device having a multilayer gate structure including a floating gate and a control gate.

2. Description of the Related Art

FIGS. 1 through 3 illustrates a known NAND-type EEPROM realized by utilizing shallow trench isolation (STI). FIG. 1 is a schematic plan view and FIGS. 2 and 3 are two different cross-sectional views of FIG. 1.

As shown in FIG. 2, a gate insulation film GI, which is a tunneling insulation film, is formed on a silicon substrate (Si-sub) and floating gates FG are formed thereon. The floating gates FG of adjacent cells are separated and electrically insulated from each other. The structure that separates adjacently located floating gates FG apart from each other is referred to as a slit. The floating gates FG between a pair of slits are covered at the top and the opposite lateral sides by an inter-gate insulation film IGI. Each floating gate FG can be made to hold an electric charge for a long period because it is covered by a tunneling insulation film and an inter-gate insulation film.

A control gate CG is formed on the inter-gate insulation film. Normally, a control gate CG is shared by a large number of cell transistors and adapted to drive the number of cell transistors simultaneously. The control gate CG is also referred to as word line WL.

On the other hand, the cross-sectional view of FIG. 3 is taken along a bit line BL. Stacked gate structures illustrated in FIG. 3 are arranged on the substrate in rows along the direction of bit lines BL. Each cell transistor is processed in a self-aligned manner by means of resist or a processing mask layer. In a NAND-type memory where a number of cells are connected in series by way of selection gates, adjacent cells share a source and a drain in order to reduce the area occupied by each cell. Each word line WL and the gap separating adjacent word lines WL are formed with minimum feature size by micro-processing.

Electrons are injected into a floating gate FG by applying a high write potential to the corresponding control gate CG and grounding the substrate. As cell transistors are micronized, an increased parasitic capacitance appears between adjacent cells and between a floating gate FG and a peripheral structure. For this reason, there is a tendency of raising the write voltage of cell transistors for the purpose of increasing the data writing rate. Control gates CG need to be reliably insulated from each other and word line drive circuits are required to withstand high voltages when a high voltage is used for the write voltage. This poses a problem when arranging memory elements at high density and driving them to operate at high speed.

It is possible to roughly estimate the potential required for write operation by seeing the structure shown in FIG. 1. The control gate CG and the floating gate FG and the floating gate FG and the substrate can be regarded as capacitors where the gate insulation film and the tunneling insulation film are respectively sandwiched. In other words, as seen from the control gate CG, the memory cell is equivalent to a structure where two capacitors are connected in series.

FIG. 4 is an equivalent circuit diagram of a cell that is obtained when the capacitance of the capacitor between the control gate CG and the floating gate FG is Cip and the capacitance of the capacitor between the floating gate FG and the substrate is Ctox. The electric potential Vfg of the floating gate FG when a high write potential (Vpgm=Vcg) is applied to the control gate CG is defined by Cip and Ctox and can be roughly estimated by using the formula below:

$$Vfg = Cr \times (Vcg - Vt + Vt0),$$

where $Cr = Cip/(Cip+Ctox)$ and Vt represents the threshold voltage of the cell transistor while Vto represents the threshold voltage (neutral threshold voltage) when the floating gate FG is totally free from electric charge.

The higher the electric potential Vfg of the floating gate FG, the stronger the electric field applied to the tunneling insulation film so injection of electrons into the floating gate FG can easily take place. It will be appreciated from the above formula that the value of Vfg can be raised by increasing the capacitance ratio (Cr) provided that Vcg is held to a constant level. In other words, it is necessary to make Cip have a large value relative to Ctox in order to reduce the write voltage.

The capacitance of a capacitor is proportional to the dielectric constant of the thin film arranged between the electrodes and the area of the opposed electrodes and inversely proportional to the distance between the opposed electrodes. A write/erase operation is obstructed when a leak current flows through the tunneling insulation film for allowing an electric charge to pass through for the purpose of the write/erase operation. Therefore, a technique of increasing the contact area of the gate insulation film and the floating gate FG, and that of the gate insulation film and the control gate CG is normally used to increase the value of Cip. Techniques such as increasing the top surface of the floating gate FG by reducing the width of the slit (dimension 1a in FIG. 2) and increasing the length of the lateral walls of the floating gate FG (dimension 1b in FIG. 2) by increasing the film thickness of the floating gate FG have been developed to date.

However, when such a technique is used, the slit needs to be extremely micronized relative to the dimensions of the gate and the wiring materials and the difficulty of forming the gate increases as the floating gate FG is made thicker. Additionally, the parasitic capacitance between FG—FG increases as a result of micronization. In short, it obstructs micronization of cell transistors to maintain the capacitance ratio.

It is conceivable to reduce the write voltage by modifying the configuration of the floating gate FG and the control gate CG.

As a matter of fact, Japanese Laid-Open Patent (Kokai) No. 11-145429 describes a NAND-type EEPROM that is designed to allow write/erase/read operations to be performed with a low voltage by increasing the capacitance between booster plates.

Japanese Laid-Open Patent (Kokai) No. 2002-217318 describes a nonvolatile memory device including micronized elements that are realized by raising the coupling ratio of the floating gate and the control gate and thereby reducing the write voltage.

Japanese Laid-Open Patent (Kokai) No. 2002-50703 describes a nonvolatile semiconductor memory device including MOSFETs that show improved write/erase/read characteristics and area realized by forming floating gate at opposite lateral sides of each control gate.

Furthermore, Y. Sasago et al. "10-MB/s Multi-Level Programming of Gb-Scale Flash Memory Enabled by New AG-AND Cell Technology" 2002 IEEE IEDM, pp. 952–954 describes an AG-AND memory cell where an assist gate is arranged adjacent to a floating gate.

It is still difficult to increase the capacitance between the control gate and the floating gate by means of the above described prior art. In other words, it is difficult to reduce the write voltage and realize a highly density memory cells that operates at high speed by means of the prior art.

Furthermore, there has heretofore been a problem of a short channel effect of a transistor as a result of miniaturization, and this has not been remedied yet.

BRIEF SUMMARY OF THE INVENTION

According to one aspect of the present invention, there is provided a nonvolatile semiconductor memory device including: a gate insulation film disposed on a semiconductor substrate; a plurality of floating gates including first portions which are periodically arranged in a first direction on the same plane of the substrate and which contact the gate insulation film and whose sectional shapes cut by a plane including directions parallel to the first direction and vertical to the substrate are substantially rectangular, and second portions which are positioned substantially in middle portions of the first portions and whose sectional shapes cut by a plane including directions parallel to the first direction and vertical to the substrate are substantially rectangular and whose lengths in the direction parallel to the first direction are smaller than those of the first portions; a plurality of control gates including third portions which are periodically arranged in the first direction in such a manner that the third portions are positioned between the plurality of floating gates and on side surfaces of the floating gates positioned on opposite end portions of the arrangement of the plurality of floating gates and which are positioned between the second portions of a pair of adjacent floating gates; and an inter-gate insulation film disposed to insulate between each of the plurality of floating gates and each of the plurality of control gates and between each of the plurality of control gates and the substrate, wherein a plurality of memory cells constituted of each of the plurality of floating gates and a pair of control gates positioned on opposite sides of the floating gate are arranged, a pair of adjacent memory cells share one control gate positioned between the memory cells, and each floating gate is driven by capacitor coupling between the pair of control gates positioned on the opposite sides of each floating gate and the floating gate in each memory cell.

BRIEF DESCRIPTION OF THE SEVERAL VIEWS OF THE DRAWING

FIG. 4 is an equivalent circuit diagram of FIG. 1;

FIG. 6 is a sectional view of the cell array of FIG. 5;

FIG. 7 is another sectional view of the cell array of FIG. 5;

FIG. 11 is a schematic sectional view of a memory cell different from that of the first embodiment;

FIGS. 12A and 12B are sectional views showing a first step of a method of manufacturing the nonvolatile semiconductor memory device of the first embodiment;

FIGS. 13A and 13B are sectional views showing a step subsequent to FIGS. 12A and 12B;

FIGS. 14A and 14B are sectional views showing a step subsequent to FIGS. 13A and 13B;

FIGS. 15A and 15B are sectional views showing a step subsequent to FIGS. 14A and 14B;

FIGS. 16A and 16B are sectional views showing a step subsequent to FIGS. 15A and 15B;

FIGS. 17A and 17B are sectional views showing a step subsequent to FIGS. 16A and 16B;

FIGS. 18A and 18B are sectional views showing a step subsequent to FIGS. 17A and 17B;

FIGS. 19A and 19B are sectional views showing a step subsequent to FIGS. 18A and 18B;

FIG. 24 is a schematic sectional view of a memory cell according to a second embodiment;

FIG. 25 is a schematic sectional view of a memory cell in a modification of the second embodiment;

FIG. 26 is a plan view of a cell array in a nonvolatile semiconductor memory device of a third embodiment;

FIG. 27 is a sectional view of the cell array of FIG. 26;

FIG. 28 is another sectional view of the cell array of FIG. 27;

FIGS. 31A and 31B are sectional views showing a step subsequent to FIGS. 30A and 30B;

FIGS. 32A and 32B are sectional views showing a step subsequent to FIGS. 31A and 31B;

FIGS. 33A and 33B are sectional views showing a step subsequent to FIGS. 32A and 32B;

FIGS. 34A and 34B are sectional views showing a step subsequent to FIGS. 33A and 33B;

FIGS. 35A and 35B are sectional views showing a step subsequent to FIGS. 34A and 34B;

FIGS. 36A and 36B are sectional views showing a step subsequent to FIGS. 35A and 35B;

FIGS. 37A and 37B are sectional views showing a step subsequent to FIGS. 36A and 36B;

FIGS. 38A and 38B are sectional views showing a step subsequent to FIGS. 37A and 37B;

FIGS. 39A and 39B are sectional views showing a step subsequent to FIGS. 38A and 38B;

FIG. 40 is a circuit diagram showing a general NAND-type EEPROM;

DETAILED DESCRIPTION OF THE INVENTION

FIRST EMBODIMENT

Figure 1:
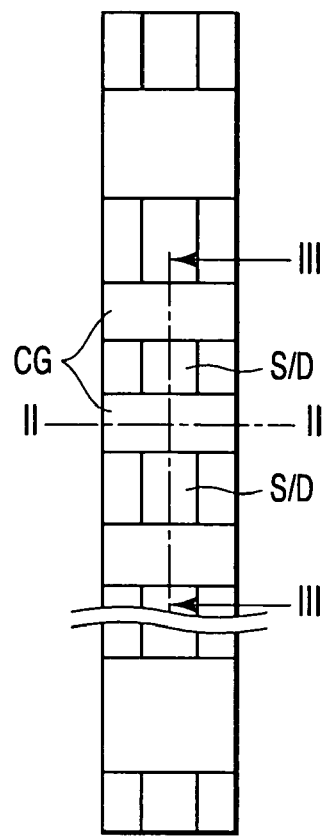
FIG. 1 is a plan view showing one example of a conventional nonvolatile semiconductor memory device.
Figure 5:
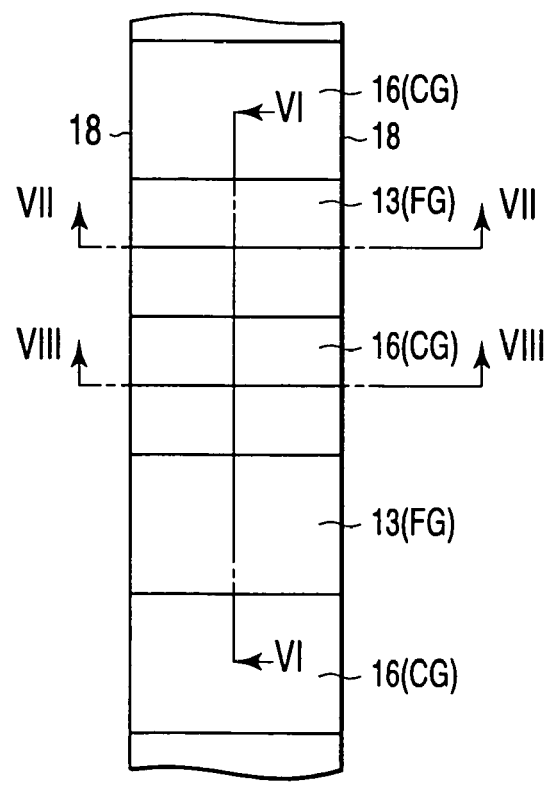
FIG. 5 is a plan view showing a cell array of a nonvolatile semiconductor memory device of a first embodiment.
Figure 2:
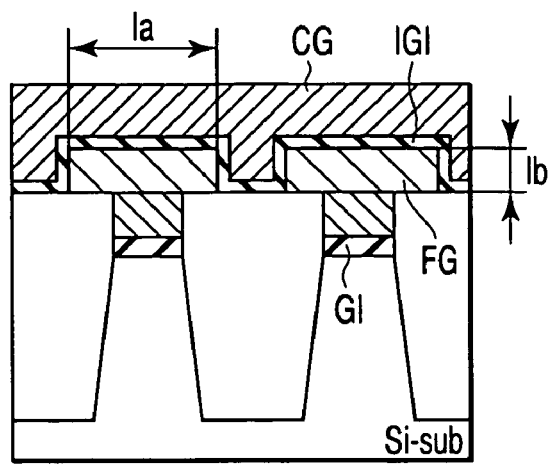
FIG. 2 is a sectional view of a nonvolatile semiconductor memory device of FIG. 1.
Figure 3:
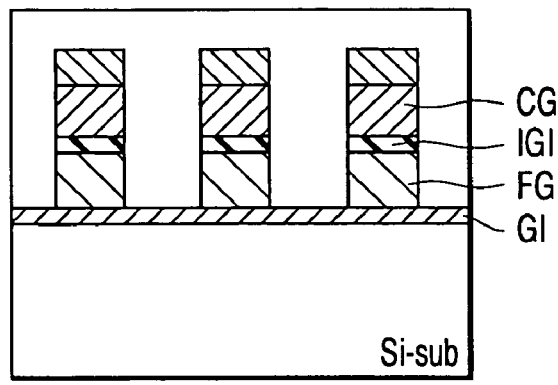
FIG. 3 is another sectional view of the nonvolatile semiconductor memory device of FIG. 1.
Figure 8:
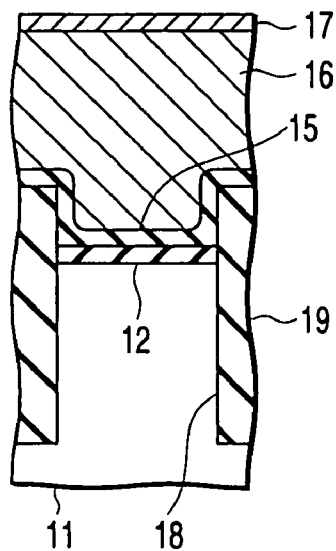
FIG. 8 is a still another sectional view of the cell array of FIG. 5.

FIGS. 5 to 8 show a constitution of a part of a cell array in a nonvolatile semiconductor memory device of a first embodiment. FIG. 5 is a plan view of the cell array, and FIGS. 6 to 8 are different sectional views of FIG. 5.

A cell array of the first embodiment is constituted of a plurality of memory cells connected in series to constitute a memory cell row, and a selection transistor for selecting the memory cell, which is connected to the memory cell row.

A gate insulation film 12 is formed on a silicon semiconductor substrate 11. A plurality of floating gates 13 (FG) are arranged and formed on the gate insulation film 12. These floating gates 13 are constituted, for example, of polysilicon into which impurities are introduced to lower a resistance. The floating gates 13 are periodically arranged in a right/left direction (first direction) in FIG. 6 on the same plane of the substrate 11. Each floating gate 13 includes a first portion 13a whose sectional shape cut by a plane including directions parallel to the first direction and vertical to the substrate 11 is substantially rectangular, and a second portion 13b which is positioned substantially in a middle portion of the first portion 13a and whose sectional shape cut by a plane including directions parallel to the first direction and vertical to the substrate 11 is substantially rectangular and whose length in the direction parallel to the first direction is smaller than that of the first portion 13a. That is, the sectional shape of each floating gate 13 in the first direction is formed into an upward convex shape. A mask layer 14 constituted of an insulation film is formed on each floating gate 13.

An inter-gate insulation film 15 is continuously formed over a whole surface including upper portions of the plurality of floating gates 13. The inter-gate insulation film 15 has a film thickness larger than that of the gate insulation film 12. Moreover, a plurality of control gates 16 (CG) is formed via the inter-gate insulation film 15 in such a manner that the control gates are positioned between the floating gates 13 and on side surfaces of the floating gates positioned on opposite end portions. Each of the control gates 16 (CG) is constituted, for example, of polysilicon into which impurities are introduced to lower the resistance. The plurality of control gates 16 is periodically arranged in the right/left direction (first direction) in FIG. 6 on the same plane of the substrate 11. Each control gate 16 is constituted of a third portion 16a positioned between the second portions 13b of a pair of adjacent floating gates 13, and a fourth portion 16b positioned between the first portions 13a of a pair of adjacent floating gates 13 and integrated with the third portion 16a.

That is, the sectional shape of each of the control gates 16 in the first direction is formed into a downward convex shape. The fourth portion 16b of each control gate 16 faces the substrate 11 via the inter-gate insulation film 15 and the gate insulation film 12. A metal salicide layer 17 is formed on the control gates 16.

In the cell array of the first embodiment, one floating gate 13 and a pair of control gates 16 positioned on the opposite sides of the floating gate 13 constitute one memory cell. Moreover, a pair of adjacent memory cells shares the control gate 16 positioned between the floating gates 13.

As shown in FIGS. 7 and 8, a shallow trench 18 for shallow trench isolation (STI), disposed between the floating gates 13 and extended in the first direction, is formed in the substrate 11. An insulation film 19 for the shallow trench isolation is buried in the trench 18 to isolate the plurality of memory cell rows from each other.

In a conventional cell, one floating gate has heretofore been driven by one control gate. On the other hand, in the memory cell of the first embodiment, the floating gate 13 is driven by two control gates 16 positions on the opposite sides of the floating gate.

Figure 9:
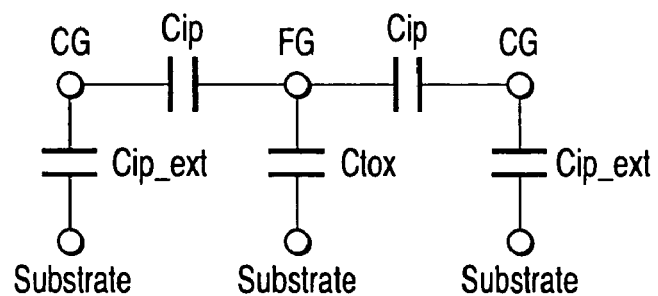
FIG. 9 is an equivalent circuit diagram of a memory cell of a first embodiment.

FIG. 9 shows an equivalent circuit of the memory cell of the first embodiment. Here, Cip denotes the capacitance between a control gate CG and a floating gate FG, Cip_ext denotes the capacitance between the control gate CG and the substrate, and Ctox denotes the capacitance between the floating gate FG and the substrate. Assuming that two control gates CG adjacent to one floating gate FG has an equal potential (Vcg) in this equivalent circuit, the capacitance ratio (Cr) which determines a potential Vfg of the floating gate is roughly estimated by the following equation:

$$Cr = Cip/(Cip + Ctox)$$
$$= (2 \times \varepsilon ip \times W \times Tfg/Tip)/\{(2 \times \varepsilon ip \times W \times Tfg/Tip) + \varepsilon tox \times W \times L/Ttox\}$$

where $\in ip$ denotes the dielectric constant of the intergate insulation film 15, $\in tox$ denotes the dielectric constant of the gate insulation film 12, W denotes the channel width of a cell transistor, L denotes the gate length of the cell transistor, Tfg denotes the film thickness of the floating gate 13 (FG), Ttox denotes the film thickness of the gate insulation film 12, and Tip denotes the film thickness of the inter-gate insulation film 15.

It will be appreciated from the above-described equation that Cr can be increased by increasing the film thickness Tfg of the inter-gate insulation film 15 without changing the channel width or gate length of the transistor which should be a minimum feature size. This means that the capacitance ratio can be improved, even if the cell is miniaturized.

Moreover, as shown in FIG. 6, a space between the floating gates 13 is substantially completely filled with the control gate 16. Therefore, two parasitic capacitances including the coupling capacitance between the floating gates adjacent to each other in the word line (WL) direction and the fringe capacitance between the substrate and the floating gate are almost shielded, which have heretofore posed a problem in a conventional cell.

As described above, in the cell transistor of the first embodiment, the capacitance ratio can be secured by increasing the film thickness of the floating gate without considering any increase of the parasitic capacitance. As a result, even if the gate length, the channel width or the like of the cell transistor is miniaturized, the capacitance ratio can be increased. Additionally, since the capacitance ratio can be increased, the write voltage can be reduced. Therefore, the memory cell of the first embodiment simultaneously satisfies the miniaturization of the cell and the reduction of the write voltage.

Figure 10:
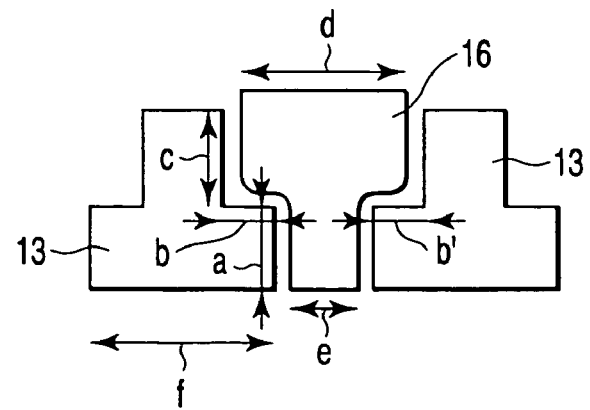
FIG. 10 is a schematic sectional view of the memory cell of the first embodiment.

FIG. 10 shows one control gate 16 and two floating gates 13 disposed on the opposite sides of the floating gate 16, extracted from the first embodiment. Various dimensions in the floating gates 13 and the control gate 16 are shown as a to f. In FIG. 10, it is assumed that fluctuations are generated in a dimension a that is the height of the first portion 13a of the floating gate 13 between wafers or in the wafer plane. However, when a dimension b that is the distance between an end portion of the first portion 13a of the floating gate 13 and a rising portion of the second portion 13b has a certain length, no fluctuation is not generated in the coupling capacitance between the floating gate 13 and the control gate 16. The reason is that the dimension of the sum (a+b+c) of the above-described dimensions a and b, and the height c of the second portion 13b of the floating gate 13 is constant.

Furthermore, the surface region of the silicon semiconductor substrate 11 under the control gate 16 constitutes a source/drain region of the cell transistor, and the channel of the cell transistor is formed on the surface of the substrate under the first portion 13a of the floating gate 13. Here, it is considered that the sectional shapes of each floating gate 13 and each control gate 16 are formed into rectangular shapes as shown in a sectional view of FIG. 11, instead of forming the sectional shapes into the upward and downward convex shapes, on the conditions that the floating gate 13 and the control gate 16 have an equal pitch.

As compared with the memory cell of FIG. 11, in the memory cell of FIG. 10, the dimension e of the fourth portion 16b of the control gate 16, parallel to the first direction, can be reduced. Therefore, the dimension f of the first portion 13a of the floating gate 13, corresponding to the channel length of the cell transistor, can be lengthened. Accordingly, the short channel effect caused by miniaturization can be improved.

It is to be noted that a diffusion layer constituted of the source/drain region is not formed on the cell transistor of the first embodiment. However, the source/drain region constituted of the diffusion layer in which impurities of a conductive type different from that of the substrate are diffused may also be formed on the surface region of the substrate 11 which is positioned under each floating gate 13 but is not positioned under each control gate 16.

Next, a method of manufacturing the nonvolatile semiconductor memory device of the first embodiment will be described with reference to FIGS. 12A, 12B to 22A, 22B. It is to be noted that each figure A corresponds to the sectional view of FIG. 8, mainly showing the STI, and each figure B corresponds to the sectional view of FIG. 6.

First, as shown in FIGS. 12A, 12B, the gate insulation film 12 is formed on the silicon semiconductor substrate 11. As the gate insulation film 12, a single film or laminated films containing one of silicon oxide, silicon nitride, aluminum oxide, hafnium oxide, and zirconium oxide may be used. Subsequently, on the gate insulation film 12, for example, a polysilicon layer 30 and a mask layer 31 are successively formed. As the mask layer 31, for example, silicon oxide or silicon nitride is applied. The mask layer 31 has a minimum condition that a sufficient selectivity is obtained with respect to the polysilicon layer 30 during etching of the polysilicon layer 30. However, more preferably, a sufficient selectivity with respect to an insulation film for burying is obtained in a chemical mechanical polishing (CMP) process for forming STI as described later, and a sufficient selectivity with respect to a control gate is obtained in the CMP process for forming the control gate.

Thereafter, the mask layer 31 is patterned through a lithography process and a selective etching process. The polysilicon layer 30, gate insulation film 12, and substrate 11 are successively etched using the patterned mask layer 31, and the shallow trench 18 for shallow trench isolation is formed in the substrate 11 as shown in FIGS. 13A, 13B.

Next, as shown in FIGS. 14A, 14B, the insulation film 19 constituted, for example, of a silicon oxide film is deposited on the whole surface by a chemical vapor deposition (CVD) process to fill in the trench 18. Subsequently, the mask layer 31 and the insulation film 19 are polished down to the mask layer 31 by the CMP process to form the STI.

Subsequently, as shown in FIGS. 15A, 15B, the selective etching process by the lithography process and reactive ion etching (RIE) is performed, and the polysilicon layer 30 is etched halfway in the thickness direction. Accordingly, the second portion 13b of the floating gate 13 having a substantially rectangular sectional shape is formed. At this time, an upper portion of the insulation film 19 may also be formed into a partially protruded shape in the STI.

When the upper portion of the insulation film 19 protrudes, subsequently, as shown in FIGS. 16A, 16B, the upper portion of the insulation film 19 in the STI is selectively removed, and the upper surface of the insulation film is positioned below the surface of the polysilicon layer 30.

Subsequently, as shown in FIGS. 17A, 17B, an insulation film, for example, a silicon nitride film 33 is deposited on the whole surface.

Subsequently, as shown in FIGS. 18A, 18B, the silicon nitride film 33 is etched by the RIE, and the silicon nitride films 33 are left on side walls of a laminated structure constituted of the second portions 13b of the floating gates 13 and the mask layers 31.

Subsequently, as shown in FIGS. 19A, 19B, the polysilicon layer 30 is selectively etched by the RIE using the silicon nitride films 33 as masks, and substantially rectangular first portions 13a whose lengths in a direction parallel to the first direction are larger than those of the second portions 13b are formed under the second portions 13b of the floating gates 13. Accordingly, the respective floating gates 13 are formed. Here, the height of the upper surface of the insulation film 19 for the STI is set to be lower than that of the upper surface of the first portion 13a of the floating gate 13.

Furthermore, to form the source/drain region, impurity ions are introduced into the substrate using the floating gates 13 as the masks, and diffusion layers of a conductive type different from that of the substrate 11 are formed on the surface region of the substrate 11.

Figure 20A:
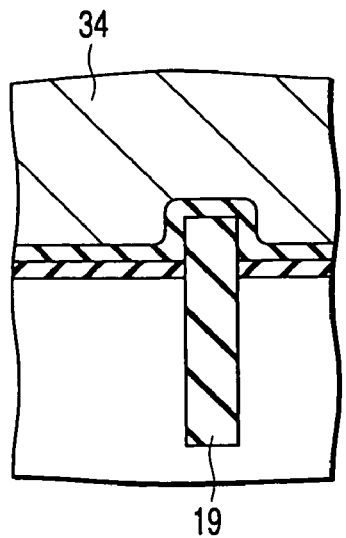
FIGS. 20A and 20B are sectional views showing a step subsequent to FIGS. 19A and 19B.
Figure 20B:
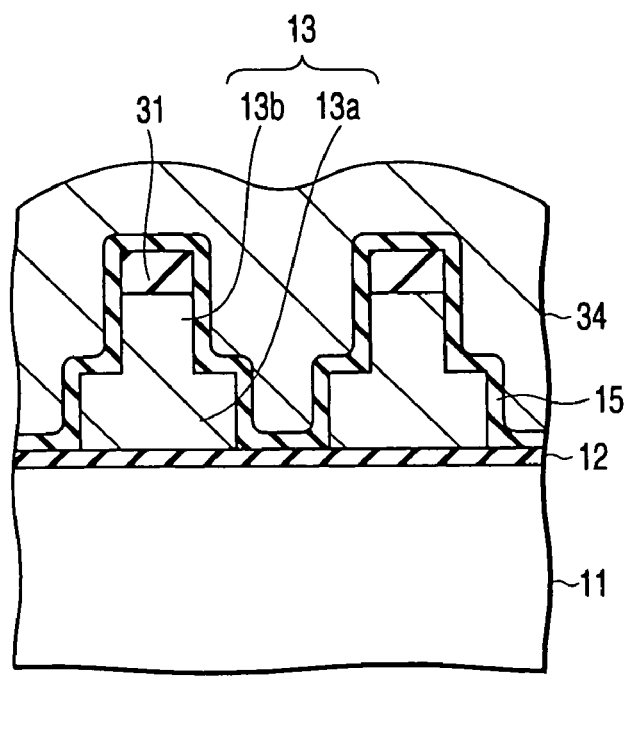

Subsequently, after the silicon nitride films 33 are removed, as shown in FIGS. 20A, 20B, the inter-gate insulation film 15 and, for example, a polysilicon layer 34 constituting control gates are successively formed on the whole surface. The inter-gate insulation film 15 is formed of one of silicon oxide, silicon nitride, aluminum oxide, hafnium oxide, and zirconium oxide, or of a laminated film containing at least two of them. As an example, a so-called ONO film including three layers made of silicon oxide, silicon nitride, and silicon oxide may be used.

Figure 21A:
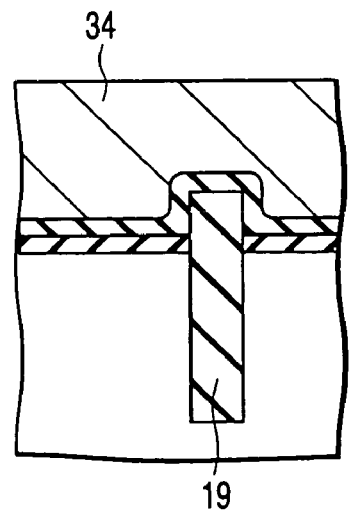
FIGS. 21A and 21B are sectional views showing a step subsequent to FIGS. 20A and 20B.
Figure 21B:
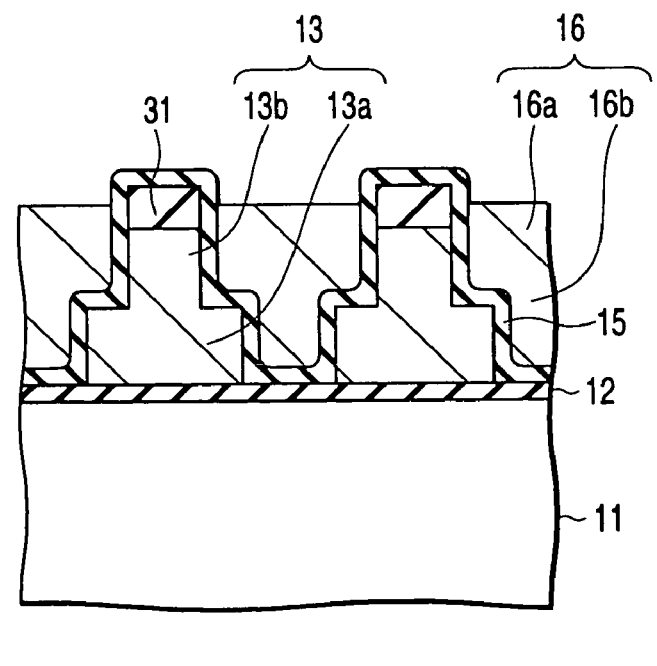

Thereafter, as shown in FIGS. 21A, 21B, the polysilicon layer 34 is etched until the inter-gate insulation film 15 on each floating gate 13 is exposed by a dry etching process or the CMP process, and each control gate 16 including a third portion 16a and a fourth portion 16b is formed.

Figure 22A:
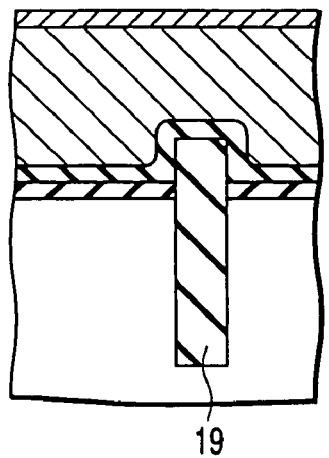
FIGS. 22A and 22B are sectional views showing a step subsequent to FIGS. 21A and 21B.
Figure 22B:
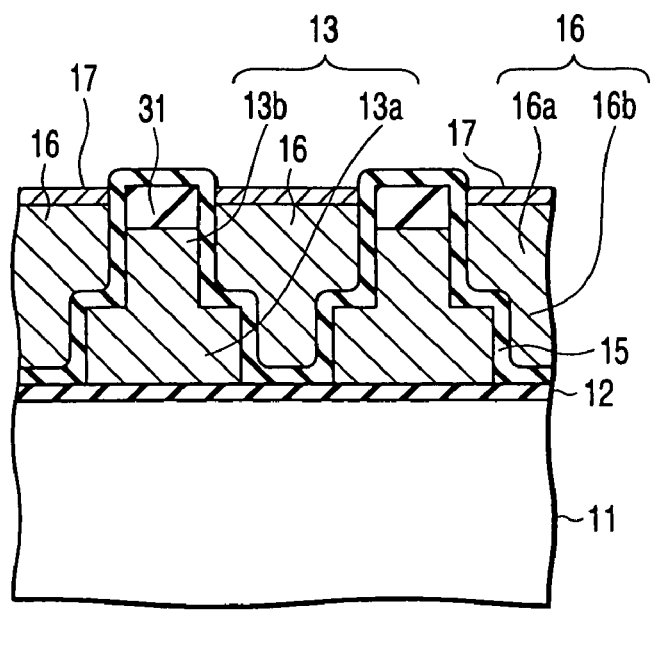

Subsequently, after depositing a metal thin film on the whole surface, heating is performed, the mask layer 31 is used as a control film for salicide reaction, and accordingly, as shown in FIGS. 22A, 22B, a metal salicide layer 17 is formed on the respective control gates 16. A non-reacted metal thin film is thereafter removed.

It is to be noted that the control gates 16 including a salicide structure thereon have been described. In the present embodiment, the control gates 16 are formed in a self-aligned manner with respect to the floating gates 13. Therefore, a new metal wiring may also be formed on the upper surfaces of the control gates 16. Furthermore, the control gates 16 themselves may also be formed using metal materials. To cope with this configuration, the following materials can be applied to the control gates 16.

Examples of the metal material applied to the salicide structure include titanium, cobalt, and nickel. When the control gate 16 is formed of the metal material, one of titanium, tungsten, tungsten nitride, and titanium nitride or a laminated film containing at least two of them can be applied.

In the present embodiment, the control gates 16 are formed on the opposite side surfaces of the floating gates 13 via the inter-gate insulation film 15. Therefore, capacitor coupling between the floating gate 13 and the control gate 16 increases compared with before. Therefore, the wiring of the control gate 16 needs to be formed of a material having a sufficiently low resistance, and the metal salicide layer 17 formed on the control gate 16 is useful in lowering the wiring resistance of the control gate.

In this manner, in the cell array of the first embodiment, the first and second portions 13a, 13b of each floating gate 13 are integrated and formed using the same material. When the first and second portions 13a, 13b are formed, alignment error by the lithography process is not generated, and therefore the second portion 13b can be positioned substantially on a middle portion of the first portion 13a.

MODIFICATION OF FIRST EMBODIMENT

Figure 23A:
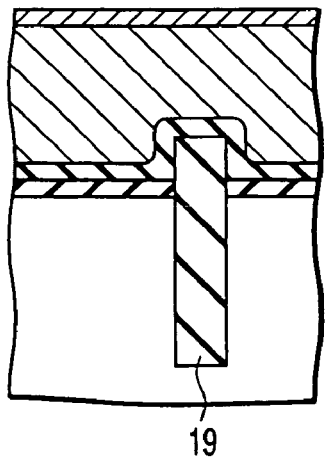
FIGS. 23A and 23B are sectional views showing a sectional structure of a cell array in a modification of the first embodiment.
Figure 23B:
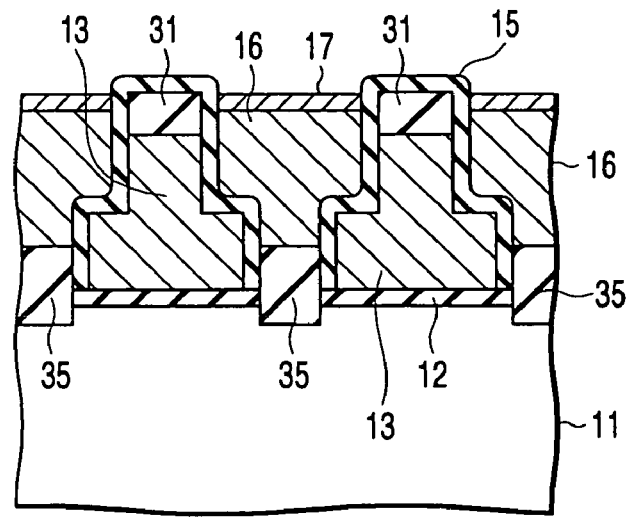

FIGS. 23A, 23B show a sectional structure of a cell array in a modification of the first embodiment. Even in this case, FIG. 23A corresponds to the sectional view of FIG. 8, mainly showing the STI, and FIG. 23B corresponds to the sectional view of FIG. 6.

The cell array in the modification is different from that of the first embodiment in that the intergate insulation films 15 and the gate insulation films 12 formed between the fourth portions 16b of the control gates 16 and the substrate 11 are omitted, and insulation films 35 having film thickness larger than those of the gate insulation films 12 and the intergate insulation films 15 are formed in the corresponding portions. Since the other constitution is similar to that of FIGS. 22A, 22B, the description is omitted.

Since the insulation film 35 having a large film thickness is formed between the control gate 16 and the substrate 11 in this manner, the insulation film 35 is disposed between a pair of adjacent floating gates 13, and the proximity effect between a pair of adjacent floating gates 13 is reduced.

SECOND EMBODIMENT

FIG. 24 shows one control gate 16 and two floating gates 13 disposed on the opposite sides of the control gate which are extracted from a cell array of a second embodiment. FIG. 24 corresponds to the sectional view of FIG. 10 of the first embodiment.

In the first embodiment, each control gate 16 includes the third portion 16a positioned between the second portions 13b of a pair of adjacent floating gates 13, and the fourth portion 16b positioned between the first portions 13a of a pair of adjacent floating gates 13 and integrated with the third portion 16a, and is formed into a downward convex sectional shape as described above.

On the other hand, in the cell array of the second embodiment, each control gate 16 is constituted of a third portion 16a only positioned between the second portions 13b of a pair of adjacent floating gates 13 and having a rectangular sectional shape, and the fourth portion 16b is omitted.

Moreover, an insulation film 36 having a film thickness larger than that of the inter-gate insulation film 15 is formed in a region positioned under the third portion 16a and positioned between the first portions 13a of a pair of adjacent floating gates 13.

It is to be noted that even in the second embodiment, a diffusion layer constituted of the source/drain region of the cell transistor may also be formed in the substrate.

Even in this constitution, an effect similar to that of the first embodiment is obtained. Furthermore, since the insulation film 36 having a large film thickness is formed between each control gate 16 and the substrate 11, the proximity effect between a pair of adjacent floating gates 13 is reduced.

MODIFICATION OF SECOND EMBODIMENT

In the second embodiment, the insulation film 36 formed in the region positioned under the third portion 16a of the control gate 16 and between the first portions 13a of a pair of adjacent floating gates 13 has been described. On the other hand, as shown in a sectional view of FIG. 25, an air gap 37 is formed in a region positioned under the third portion 16a of the control gate 16 and between the first portions 13a of a pair of adjacent floating gates 13. Even by this constitution, an effect similar to that of the second embodiment can be obtained.

THIRD EMBODIMENT

In the first and second embodiments and the modifications, the case where the first and second portions 13a, 13b constituting the floating gate 13 are formed using the same depositing material has been described. However, the first and second portions 13a, 13b may also be formed using different depositing materials.

In a cell array of a third embodiment described hereinafter, the first and second portions 13a, 13b constituting the floating gate 13 are formed using different deposing materials.

Figure 29:
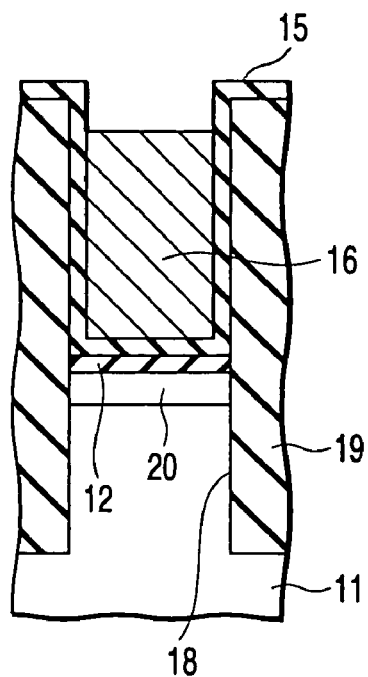
FIG. 29 is a still another sectional view of the cell array of FIG. 27.

FIGS. 26 to 29 show a constitution of a part of the cell array in a nonvolatile semiconductor memory device of the third embodiment. FIG. 26 is a plan view of the cell array, and FIGS. 27 to 29 are different sectional views of FIG. 26.

The cell array of the third embodiment is constituted of a plurality of memory cells connected in series to constitute a memory cell row, and a selection transistor for selecting the memory cell, connected to the memory cell row.

The cell array in the third embodiment is different from that of the first embodiment in that the first and second portions of the floating gate are formed using different depositing materials, the other constitution is similar to that of the first embodiment, and therefore the description is omitted.

Even in the cell array in the third embodiment, one floating gate 13 and a pair of control gates 16 positioned on the opposite sides of the floating gate constitute one memory cell, and a pair of adjacent memory cells share the control gate 16 positioned between the floating gates 13. Moreover, the floating gate 13 is driven by two control gates 16 positioned on the opposite sides of the floating gate.

Moreover, as shown in FIGS. 28 and 29, a shallow trench 18 for shallow trench isolation (STI) extended in the first direction is formed in the substrate 11, and then insulation film 19 for the shallow trench isolation is buried in the trench 18 to isolate a plurality of memory cell rows from one another.

Next, a method of manufacturing the nonvolatile semiconductor memory device of the third embodiment will be described with reference to FIGS. 30A, 30B to 39A, 39B. It is to be noted that each figure A corresponds to the sectional view of FIG. 29, mainly showing the STI, and each figure B corresponds to the sectional view of FIG. 27.

Figure 30A:
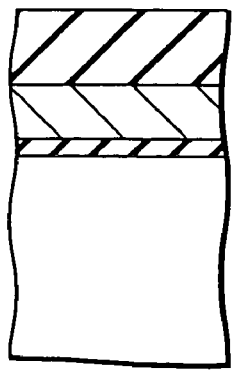
FIGS. 30A and 30B are sectional views showing a first step of a method of manufacturing the nonvolatile semiconductor memory device of a third embodiment.
Figure 30B:
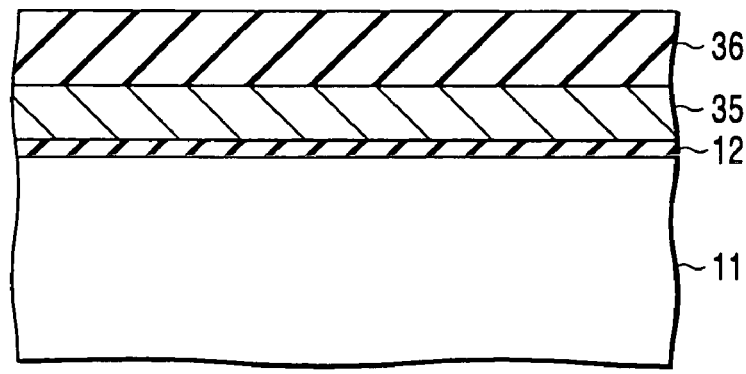

First, as shown in FIGS. 30A, 30B, the gate insulation film 12 is formed on the silicon semiconductor substrate 11. As the gate insulation film 12, a single film or laminated films containing one of silicon oxide, silicon nitride, aluminum oxide, hafnium oxide, and zirconium oxide may be used. Subsequently, on the gate insulation film 12, for example, a polysilicon layer 35 constituting a first portion 13a of each floating gate, and a mask layer 36 are successively formed. As the mask layer 36, for example, silicon oxide or silicon nitride is applied. The mask layer 36 has a minimum condition that a sufficient selectivity is obtained with respect to the polysilicon layer 35 during etching of the polysilicon layer 35.

Thereafter, the mask layer 36 is patterned by a lithography process and a selective etching process. The polysilicon layer 35 is etched using the patterned mask layer 36 to form the first portion 13a of the floating gate 13 as shown in FIGS. 31A, 31B. Thereafter, in a state in which the mask layer 36 is left, impurity ions of a conductive type opposite to that of the substrate 11 are injected into the substrate 11 to form diffusion layers 20 constituting the source/drain region (S/D) of the cell transistor. The dose amount and acceleration energy of the ions during the ion injection are adjusted to obtain desired characteristics of the cell transistor.

Subsequently, as shown in FIGS. 32A, 32B, after the mask layer 36 is removed, a new mask layer 37 is formed on the whole surface. For example, silicon oxide or silicon nitride is applied to the mask layer 37. In the mask layer 37, more preferably, a sufficient selectivity is obtained with respect to the insulation film for burying in the CMP process for forming the STI described later, and a sufficient selectivity is obtained with respect to the control gate in the CMP process for forming the control gates.

Thereafter, the mask layer 37 is patterned by the lithography process and selective etching process, and the gate insulation film 12 and substrate 11 are successively etched using the patterned mask layer 37 to form the shallow trench 18 for shallow trench isolation as shown in FIGS. 33A, 33B.

Next, as shown in FIGS. 34A, 34B, the insulation film 19 constituted, for example, of a silicon oxide film is formed on the whole surface by the CVD process to fill in the trench 18 formed in the substrate 11. Subsequently, the mask layer 37 is used as a stopper, and the insulation film 19 is polished down to the mask layer 37 by the CMP process to form the STI.

Subsequently, as shown in FIGS. 35A, 35B, the selective etching process by the lithography process and the RIE process is performed, and openings 38 connected to the surface of the first portion 13a of each floating gate 13 are formed in the mask layer 37. Thereafter, a polysilicon layer 39 for forming the second portion 13b of each floating gate 13 is deposited on the whole surface.

Subsequently, as shown in FIGS. 36A, 36B, the polysilicon layer 39 is etched by dry etching, and the polysilicon layer 39 is left halfway in the depth direction in each opening 38 to form the second portion 13b of each floating gate 13 constituted of the polysilicon layer 39. Subsequently, an insulation film 40 is deposited on the whole surface.

Subsequently, as shown in FIGS. 37A, 37B, the insulation film 40 is polished down to the mask layer 37 by the CMP process, then, the insulation film 40 and the mask layer 37 are removed to form the floating gate 13 and the mask layer 14 constituted of the insulation film 40.

Subsequently, as shown in FIGS. 38A, 38B, the inter-gate insulation film 15 and a polysilicon layer 41 are successively formed on the whole surface. The inter-gate insulation film 15 is formed of one of, for example, silicon oxide, silicon nitride, aluminum oxide, hafnium oxide, and zirconium oxide, or of a laminated film containing at least two of them. As an example, a so-called ONO film including three layers constituted of silicon oxide, silicon nitride, and silicon oxide may be used.

Thereafter, as shown in FIGS. 39A, 39B, the polysilicon layer 41 is polished until the inter-gate insulation film 15 on each floating gate 13 is exposed by the dry etching process or the CMP process, and each control gate 16 including a third portion 16a and a fourth portion 16b is formed.

It is to be noted that as shown in FIG. 39A, the control gates 16 are isolated from each other by the STI. However, in the step shown in FIG. 37A, the upper portion of the insulation film 19 for the STI, which contacts the control gate 16, is partially removed beforehand, and accordingly the control gate 16 may continue in a second direction, that is, in the right/left direction in FIG. 37A.

Subsequently, after depositing a metal thin film on the whole surface, heating is performed, and the metal salicide layer 17 is formed on the respective control gates 16 in the same manner as in the sectional views of FIGS. 22A, 22B in the first embodiment.

In the cell array of the third embodiment, the first and second portions 13a, 13b of the floating gate 13 are formed by patterning separately deposited material films. Therefore, the second portion 13b is sometimes shifted from a substantially middle portion and formed because of alignment error of the lithography process. However, although positional shift occurs, the dimension b is simply different from b' in FIG. 10, and the dimension (b+b') is constant, and therefore coupling capacitance between the floating gate 13 and the control gate 16 does not fluctuate for each cell.

Even in the present embodiment, the control gates 16 are formed in a self-aligned manner with respect to the floating gates 13. Therefore, a metal wiring may also be formed on the upper surfaces of the control gates 16. Furthermore, the control gates 16 themselves may also be formed using metal materials. To cope with this configuration, the following materials can be applied to the control gates 16.

Examples of the metal material applied to the salicide structure include titanium, cobalt, and nickel. When the control gate 16 is formed of the metal material, one of titanium, tungsten, tungsten nitride, and titanium nitride or a laminated film containing at least two of them can be applied.

In the third embodiment, the diffusion layer 20 constituting the source/drain region (S/D) of the cell transistor is formed on the surface region of the substrate between a pair of floating gates 13. However, the diffusion layer 20 may not be formed.

It is to be noted that also in the third embodiment, the inter-gate insulation film 15 and the gate insulation film 12 formed between the fourth portion 16b of the control gate 16 and the substrate 11 are omitted, and the insulation film 35 having a film thickness larger than that of the gate insulation film 12 may also be formed in the corresponding portion.

In this manner, when the insulation film 35 having a large film thickness is formed between the control gate 16 and the substrate 11, the insulation film 35 is disposed between a pair of adjacent floating gates 13, and the proximity effect between the pair of adjacent floating gates 13 is reduced.

Moreover, in the same manner as in the second embodiment, the control gate 16 is constituted of the third portion 16a only positioned between the second portions 13b of a pair of adjacent floating gates 13 and formed into a rectangular sectional shape. The insulation film 36 having a film thickness larger than that of the inter-gate insulation film 15 may also be formed in the region positioned under the third portion 16a and between the first portions 13a of a pair of adjacent floating gates 13.

Furthermore, in the same manner as in the modification of the second embodiment, the air gap 37 may also be formed instead of the insulation film 36.

Next, an operation of the nonvolatile semiconductor memory device according to the first to third embodiments will be described.

Figure 41:
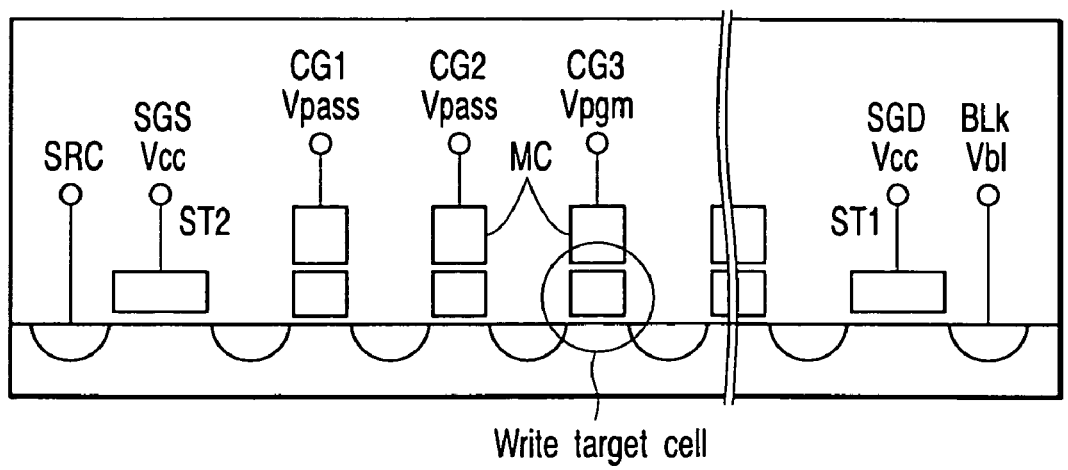
FIG. 41 is a diagram showing an example of a potential in a case where data is written in the memory cell shown in FIG. 40.

First, a general NAND-type EEPROM will be described with reference to FIGS. 40, 41. FIG. 40 shows a circuit constitution of the NAND-type EEPROM, and FIG. 41 shows an example of a potential in a case where data is written in the memory cell in this NAND-type EEPROM. In FIGS. 40 and 41, the same components are denoted with the same reference numerals.

In the NAND-type EEPROM, a plurality of memory rows is disposed. In each memory row, a plurality of cell transistors which are memory cells MC are connected in series, a selection gate ST1 is connected between one end of the row and a bit line BL, and a selection gate ST2 is connected between the other end of the row and a source line SRC.

A predetermined gate potential Vsg is applied to a selection gate line SGD on the side of the bit line BL at a data write time. A sufficiently low potential Vbl is supplied to the bit line BL. The gate potential Vsg is set to a potential at which the selection gate ST1 can be sufficiently turned on with respect to Vbl. When Vbl is supplied to the bit line, the selection gate ST1 turns on, and Vbl is transmitted to the cell transistor. Therefore, a channel potential of the cell transistor sufficiently drops, and the data is written.

In the general EEPROM, at the data write time, capacitive coupling between the control gate and the floating gate is used in either an operation for applying a write potential Vpgm to a selected word line WL (CG3 in FIG. 40) to write data into the cell or an operation for applying a transfer potential Vpass to a non-selected word line WL (except CG3 in FIG. 40) to form a channel.

Figure 42:
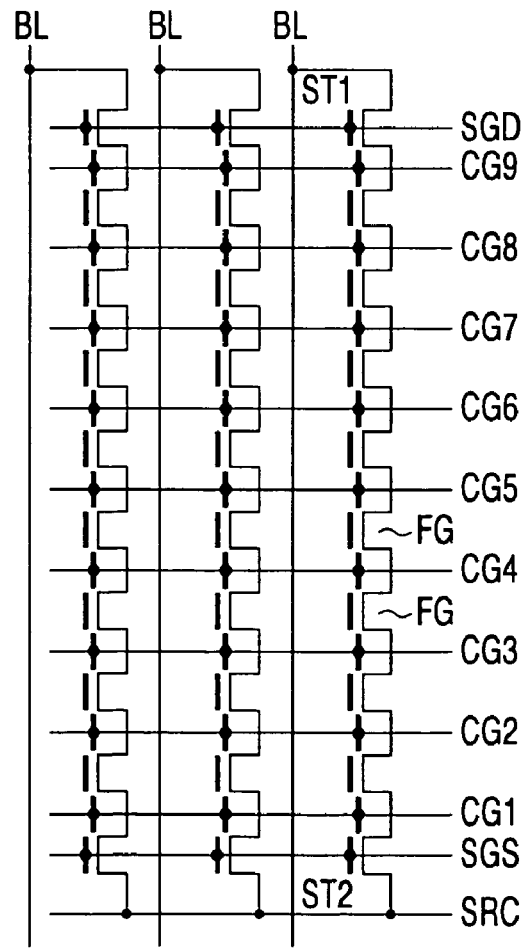
FIG. 42 is a circuit diagram showing a constitution of the nonvolatile semiconductor memory device of the first, second and third embodiments.
Figure 43:
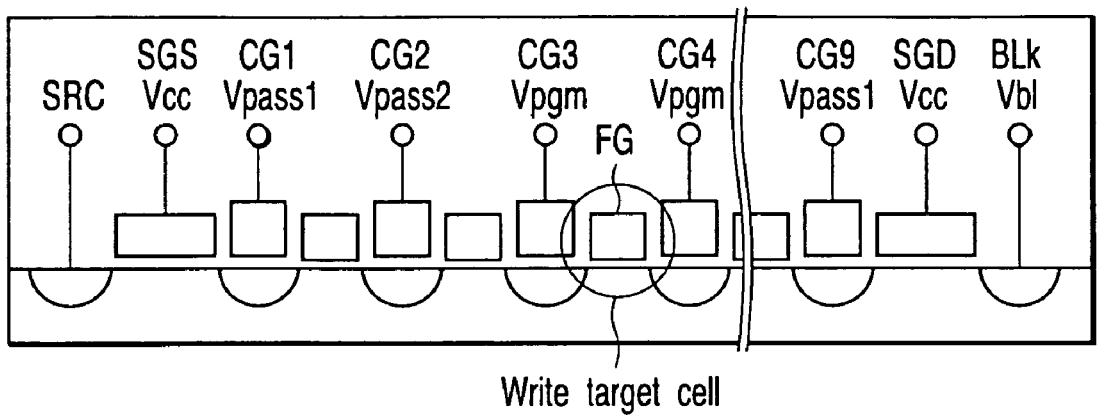
FIG. 43 is a diagram showing an example of a potential applied to each section in a case where the data is written together with a schematic section of the circuit of FIG. 42.

FIG. 42 shows a circuit constitution of the nonvolatile semiconductor memory device of the first, second and third embodiments, and FIG. 43 shows an example of a potential applied to each section in a case where data is written together with a schematic section of the circuit. It is to be noted that in the following description, an example of each cell transistor in which a diffusion layer constituting the source/drain region is formed will be described, but this also applies to a case where the diffusion layer constituting the source/drain region is not formed.

As shown, in the nonvolatile semiconductor memory device of the first, second and third embodiments, N (eight in the present example) cell transistors are connected in series to constitute the memory cell row. In each memory cell row, (N+1) control gates are disposed with respect to N cell transistors.

As described above, one floating gate FG shares two control gates CG, and one floating gate FG is selected by two control gates CG. That is, the floating gate FG is driven by capacitor coupling between two control gates CG and one floating gate FG.

Figure 44:
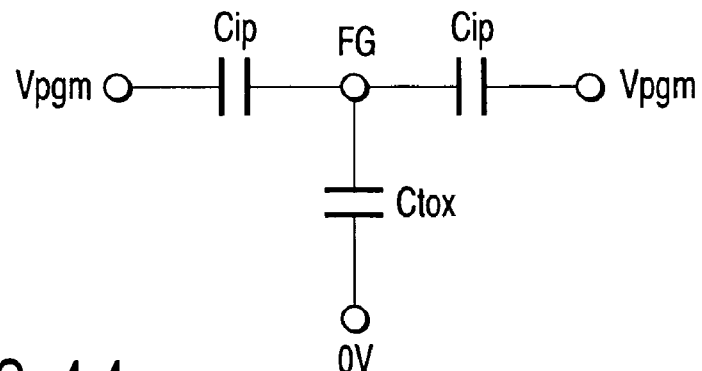
FIG. 44 is an equivalent circuit diagram showing one example of potential setting in a case where the data is written in a cell shown in FIG. 42.

At write time, for example, an equal write voltage Vpgm is applied to two control gates CG adjacent to the floating gate FG of a write target cell to be written, and the substrate (P-type substrate) is set, for example, to 0 V. An equivalent circuit of the write cell is shown in FIG. 44. In this state, an electric charge is injected into the floating gate FG from the substrate.

As described in the first, second and third embodiments, the capacitance ratio can be increased regardless of the miniaturization of the device, and Vpgm can be reduced more than before.

It is to be noted that the potentials applied to each control gate CG and selection gates SGD, SGS are generated by a row decoder circuit which is a control gate driving circuit.

In the write operation, a case where the equal voltage is supplied to two control gates CG to drive the floating gate FG has been described. However, different potentials may also be supplied to two control gates CG.

Figure 45:
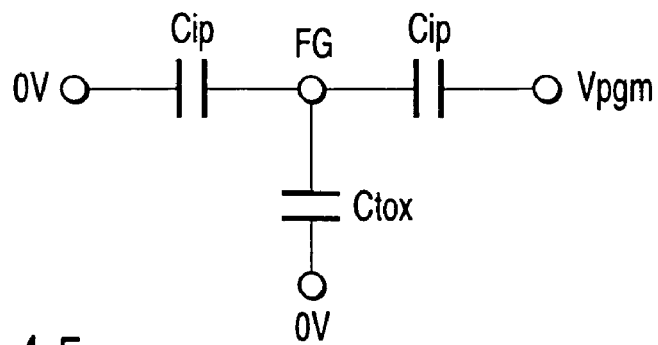
FIG. 45 is an equivalent circuit diagram showing another example of the potential setting in a case where the data is written in the cell shown in FIG. 42.

FIG. 45 shows the equivalent circuit of the write target cell in a case where Vpgm is supplied to one control gate CG, and 0 V is supplied to the other control gate CG. In FIG. 45, it is assumed that a capacitance ratio of Cip to Ctox is 1.5:1 and no charge is injected into the floating gate FG in a neutral threshold voltage and the existing threshold voltage is 0 V.

The potential Vfg of the floating gate FG shown in FIG. 45 is as follows:

$$Vfg = Vpgm \times 2 \times Cip / (2 \times Cip + Ctox)$$
$$= 0.75 \times Vpgm$$

On the other hand, the potential Vfg of the floating gate FG shown in FIG. 45 is as follows:

$$Vfg = Vpgm \times Cip / (2 \times Cip + Ctox)$$
$$= 0.375 \times Vpgm$$

In this manner, when the potential of one of two control gates CG is changed, the capacitance ratio can be largely controlled.

Figure 46:
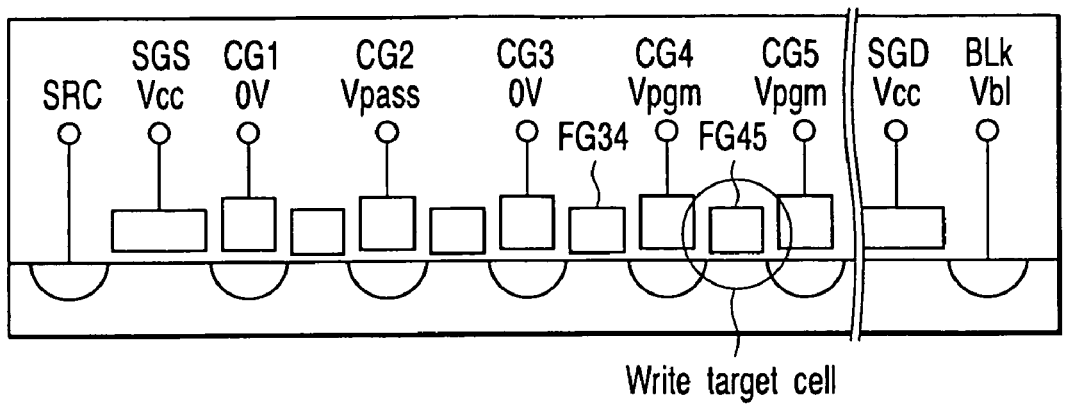
FIG. 46 is a diagram showing an example of the writing of the data using the potential setting shown in FIG. 45.

FIG. 46 shows an example of the writing of the data using the above-described characteristics. In FIG. 46, Vpgm are applied to the control gates CG4, CG5 on the opposite sides of the write target cell. By the use of the above-described assumption, a potential of 0.75×Vpgm is applied to the floating gate FG45 of the write target cell. While 0 V is applied to one (CG3) of two control gates CG positioned on the left side of the write target cell, and Vpgm is applied to the other control gate (CG5). Therefore, a potential of 0.375×Vpgm is applied to the floating gate FG34 of the cell positioned on the left side of the write target cell. Therefore, an electric field stress to the cell disposed on the left side is ½ of that of the floating gate FG of the selected cell, which is sufficient for suppressing any write error. A predetermined potential Vpass for boosting the channel potential is applied to the control gate CG2 further distant from the selected cell. At an actual device operation time, the potentials of the control gates CG are appropriately combined in consideration of write characteristics, channel boosting characteristics, potential transfer characteristics and the like.

Figure 47:
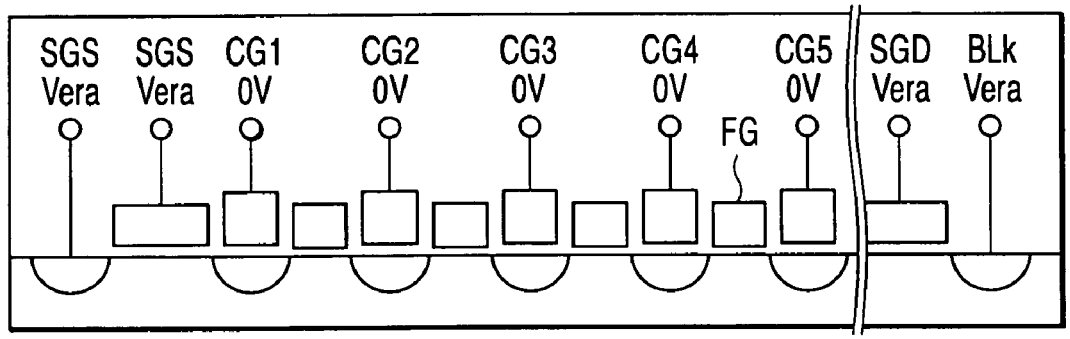
FIG. 47 is a diagram showing one example of the potential applied to each section in a case where the data is erased in the nonvolatile semiconductor memory device of the first, second and third embodiments.

FIG. 47 shows a cross-sectional view of the nonvolatile semiconductor memory device according to the first to third embodiments, and shows an example of the potential applied to each part in a case where the data is erased.

When the data is erased, the substrate (P-type substrate) on which the memory cells are formed is boosted to an erase potential Vera. Moreover, the diffusion layer connected to the bit line BL and source line SRC and the selection gates SGS, SGD are boosted to the potential Vera equal to that of the substrate in order to prevent collapse. Furthermore, a sufficiently low potential, for example, 0 V is supplied to the control gate CG positioned adjacent to the cell to be erased. Then, the charges are pulled toward the boosted substrate from the floating gate FG, and the data is erased.

It is to be noted that the control gate CG is floating state in a non-erased cell. In this case, the potential of the control gate CG is boosted to the substrate potential by the capacitive coupling with the substrate, and the data is inhibited from being erased.

In this manner, even in the memory having the cell structure in which the control gates CG are disposed on the opposite sides of the floating gate FG, the data can be securely erased.

Figure 48:
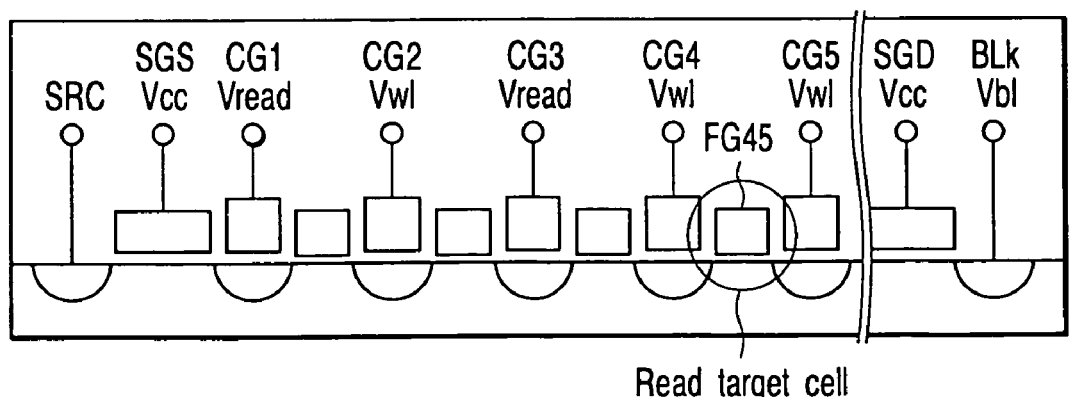
FIG. 48 is a diagram showing one example of the potential applied to each section in a case where the data is read in the nonvolatile semiconductor memory device of the first, second and third embodiments.

FIG. 48 shows a cross-sectional view of the nonvolatile semiconductor memory device according to the first to third embodiments, and shows an example of the potential applied to each part in a case where the data is read.

In FIG. 48, read voltages Vwl are supplied to two control gates CG (CG4, CG5) adjacent to the floating gate FG (FG45) of a read target cell. The read voltage Vwl is preferably set to an appropriate potential in consideration of the write characteristics, data holding characteristics, an operation range of a cell transistor threshold voltage and the like. Assuming that a read voltage Vwl=0 V is set, a potential of 0 V is applied to the floating gate FG of the read cell.

On the other hand, a potential Vread for passing a cell current is applied to the control gate CG further adjacent to two control gates CG positioned on the opposite sides of the read target cell. The potential Vread is preferably set to an appropriate potential in order to remove an influence of the non-selected cell connected to the read target cell and to judge the threshold voltage of the read target cell.

The bit line BL is connected to a sense amplifier circuit having a latch function, and the threshold voltage of the read target cell is judged in the sense amplifier circuit to sense the data at the read time. Here, at the read time, the threshold voltage is judged with respect to only the cell in which both the control gates CG disposed on the opposite sides of the cell indicate a read voltage Vwl. On the other hand, the cell in which the potentials of two control gates CG indicate a combination different from the above-described combination is brought into an on-state regardless of the stored data.

Figure 49:
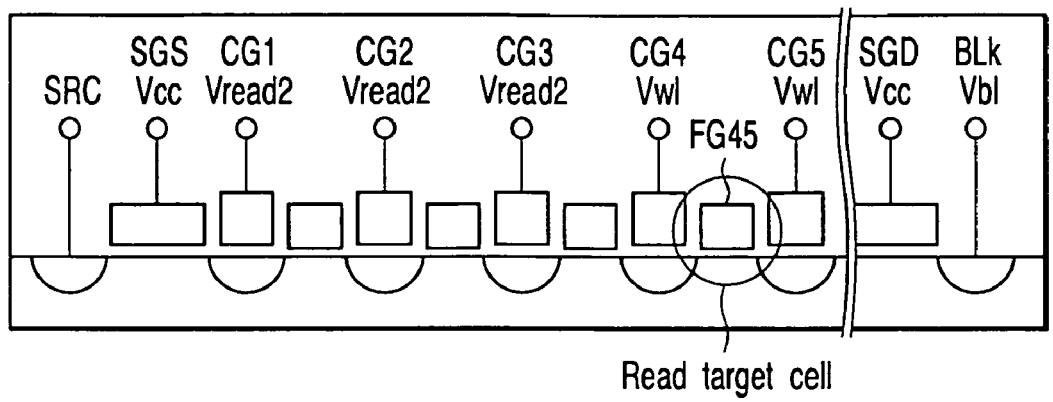
FIG. 49 is a diagram showing another example of the potential applied to each section in a case where the data is read in the nonvolatile semiconductor memory device of the first, second and third embodiments.

FIG. 49 shows a cross-sectional view of the nonvolatile semiconductor memory device according to the first to third embodiments, and shows another example of the potential applied to each part in a case where the data is read.

In this example, read voltages Vwl are supplied to two control gates CG (CG4, CG5) adjacent to the floating gate FG (FG45) of the read target cell. A potential Vread2 for passing the cell current is applied to the other control gate CG (CG1, CG2, etc.).

Figure 50:
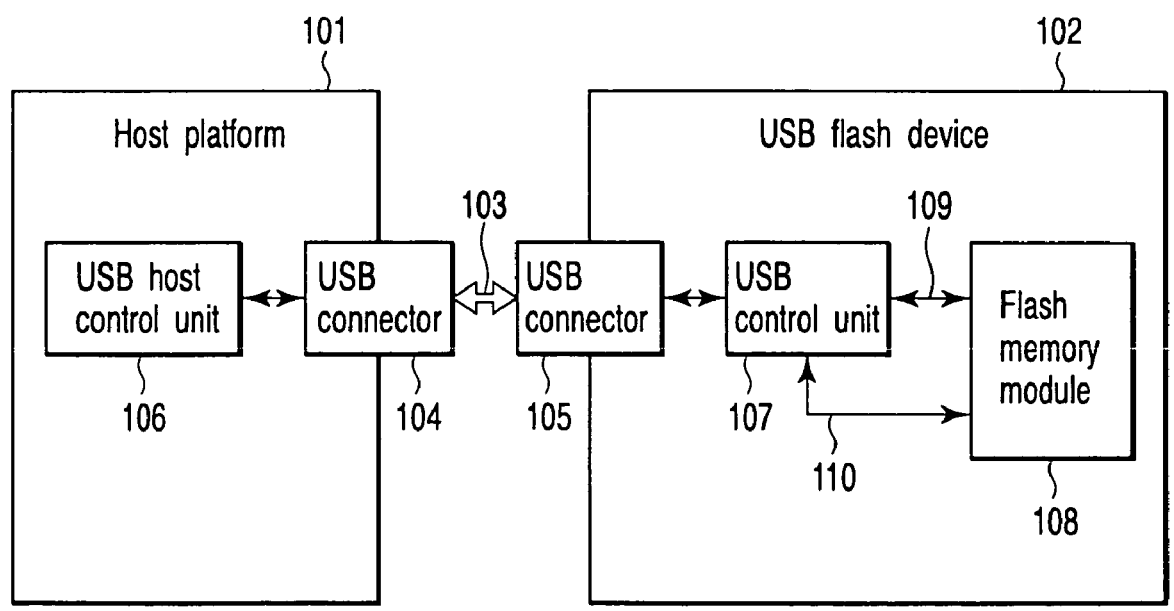
FIG. 50 is a block diagram of a flash memory system of an application example of the present invention.

Next, an application example of the nonvolatile semiconductor memory device of the present invention will be described. FIG. 50 is a block diagram showing a schematic constitution of a flash memory system to which the nonvolatile semiconductor memory device of the present invention is applied. As shown, the flash memory system of the application example comprises a host platform 101 and a universal serial bus (USB) flash device 102.

The host platform 101 is connected to the USB flash device 102 via a USB cable 103. The host platform 101 is connected to the USB cable 103 via a USB host connector 104, and the USB flash device 102 is connected to the USB cable 103 via a USB flash device connector 105. The host platform 101 includes a USB host control unit 106 which controls packet transmission on the USB bus 103.

The USB flash device 102 includes: a USB flash device control unit 107 which controls other elements in the device 102 and which also controls an interface of the device 102 into the USB bus 103; the USB flash device connector 105; and at least a flash memory module 108 including the nonvolatile semiconductor memory device of the present invention.

When the USB flash device 102 is connected to the host platform 101, a standard USB listing process starts. In the process, the host platform 101 recognizes the USB flash device 102 to select a communication mode with the USB flash device 102, and transfers/receives data with respect to the USB flash device 102 via a FIFO buffer, which is referred to as an end point, and in which transfer data is stored. The host platform 101 recognizes physical or electrical state changes such as detachment/attachment of the USB flash device 102 via the other end point, and receives a packet to be received, if any.

When the host platform 101 sends a request packet to the USB host control unit 106 to request for services from the USB flash device 102. The USB host control unit 106 transmits the packet onto the USB cable 103. When the USB flash device 102 has an end point that has received the request packet, the requests are accepted by the USB flash device control unit 107.

The USB flash device control unit 107 performs various operations such as read, write, and erase of the data with respect to the flash memory module 108. Moreover, basic USB functions such as acquisition of a USB address are supported. The USB flash device control unit 107 controls the flash memory module 108 via a control line 109 which controls an output of the flash memory module 108, or various signals such as a chip enable signal/CE and a read/write signal. The flash memory module 108 is connected to the USB flash device control unit 107 via an address data bus 110. The address data bus 110 transfers a command of read, write, or erase with respect to the flash memory module 108, and address and data of the flash memory module 108.

To inform the host platform 101 of results and states with respect to various operations required by the host platform 101, the USB flash device 102 transmits a state packet using a state end point (end point 0). In this process, the host platform 101 checks whether or not there is a state packet (poling), and the USB flash device 102 returns a blank packet, or the state packet itself, when there is no packet indicating a new state message.

Various functions of the USB flash device can be carried out as described above. It is to be noted that in FIG. 50, the USB cable 103 may be omitted to directly connect the connector 104 to the connector 105.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents. For example, a case where a plurality of memory cells are connected in series, and connected to the NAND-type has been described with reference to FIG. 42, but a plurality of memory cell transistors may also be connected to an AND-type.

What is claimed is:

1. A nonvolatile semiconductor memory device comprising:
    a gate insulation film disposed on a semiconductor substrate;
    a plurality of floating gates including first portions which are periodically arranged in a first direction on the same plane of the substrate and which contact the gate insulation film and whose sectional shapes cut by a plane including directions parallel to the first direction and vertical to the substrate are rectangular, and second portions which are positioned in middle portions of the first portions and whose sectional shapes cut by a plane including directions parallel to the first direction and vertical to the substrate are rectangular and whose lengths in the direction parallel to the first direction are smaller than those of the first portions;
    a plurality of control gates including third portions which are periodically arranged in the first direction in such a manner that the third portions are positioned between the plurality of floating gates and on side surfaces of the floating gates positioned on opposite end portions of the arrangement of the plurality of floating gates and which are positioned between the second portions of a pair of adjacent floating gates; and
    an inter-gate insulation film disposed to insulate between each of the plurality of floating gates and each of the plurality of control gates and between each of the plurality of control gates and the substrate,
    wherein a plurality of memory cells each constituted of each of the plurality of floating gates and a pair of control gates positioned on opposite sides of the floating gate are arranged, a pair of adjacent memory cells share one control gate positioned between the memory cells, and each floating gate is driven by capacitor coupling between the pair of control gates positioned on the opposite sides of each floating gate in each memory cell.

2. The nonvolatile semiconductor memory device according to claim 1, wherein each of the plurality of control gates further includes a fourth portion positioned between the first portions of a pair of adjacent floating gates and integrated with each third portion.

3. The nonvolatile semiconductor memory device according to claim 1, further comprising:
    a first insulation film disposed in a region which is positioned under the third portion of each of the control gates and which is positioned between the first portions of a pair of adjacent floating gates.

4. The nonvolatile semiconductor memory device according to claim 3, wherein the first insulation film has a film thickness which is larger than that of the inter-gate insulation film.

5. The nonvolatile semiconductor memory device according to claim 1, further comprising:
    an air gap disposed in a region which is positioned under the third portion of each of the control gates and which is positioned between the first portions of a pair of adjacent floating gates.

6. The nonvolatile semiconductor memory device according to claim 1, further comprising:
    a diffusion layer disposed in a surface region of the substrate which is positioned under each of the plurality of control gates and which is not positioned under each of the plurality of floating gates, and having a conductive type different from that of the substrate.

7. The nonvolatile semiconductor memory device according to claim 1, further comprising:
    an insulation region which is constituted of an insulation film buried in a trench disposed between the floating gates of the substrate, the trench being extended in the first direction, and the plurality of floating gates being electrically insulated from one another by the insulation region.

8. The nonvolatile semiconductor memory device according to claim 7, wherein a height of the upper surface of the insulation film of the insulation region is lower than that of the upper surface of the first portion of the floating gate.

9. The nonvolatile semiconductor memory device according to claim 1, further comprising:
    a second insulation film disposed on the second portion of each of the plurality of floating gates.

10. The nonvolatile semiconductor memory device according to claim 1, wherein a pair of control gates of one memory cell are set to potentials which are different from each other.

11. The nonvolatile semiconductor memory device according to claim 1, wherein the inter-gate insulation film is constituted of a single film or laminated films containing one selected from the group including of silicon oxide, silicon nitride, aluminum oxide, hafnium oxide, and zirconium oxide.

12. The nonvolatile semiconductor memory device according to claim 1, wherein the inter-gate insulation film has a film thickness which is larger than that of the gate insulation film.

13. The nonvolatile semiconductor memory device according to claim 1, wherein the gate insulation film is constituted of a single film or laminated films containing one selected from the group including of silicon oxide, silicon nitride, aluminum oxide, hafnium oxide, and zirconium oxide.

14. The nonvolatile semiconductor memory device according to claim 1, wherein the floating gates and the control gates are constituted of polysilicon.

15. The nonvolatile semiconductor memory device according to claim 1, wherein the control gate is constituted of a salicide structure containing one metal selected from the group including of titanium, cobalt, and nickel.

16. The nonvolatile semiconductor memory device according to claim 1, wherein the control gate is constituted of laminated films containing one or more selected from the group including of titanium, tungsten, tungsten nitride, and titanium nitride.

17. The nonvolatile semiconductor memory device according to claim 1, wherein the control gate is connected to a wiring layer made of one metal selected from the group consisting of tungsten, aluminum, and copper.

18. The nonvolatile semiconductor memory device according to claim 1, wherein the plurality of memory cells is connected into a NAND-type.

19. The nonvolatile semiconductor memory device according to claim 1, wherein the plurality of memory cells is connected into an AND-type.

20. The nonvolatile semiconductor memory device according to claim 1, wherein the plurality of memory cells are connected in series to constitute a memory cell row, and the memory cell row in which N (N is a positive integer of 2 or more) memory cells are connected in series includes (N+1) control gates.

* * * * *